United States Patent
Agrawal et al.

(10) Patent No.: US 6,653,860 B2
(45) Date of Patent: Nov. 25, 2003

(54) ENHANCED MACROCELL MODULE HAVING EXPANDABLE PRODUCT TERM SHARING CAPABILITY FOR USE IN HIGH DENSITY CPLD ARCHITECTURES

(75) Inventors: Om P. Agrawal, Los Altos, CA (US); Xiaojie (Warren) He, Austin, TX (US); Claudia A. Stanley, Austin, TX (US); Larry R. Metzger, Austin, TX (US); Chong M. Lee, Colorado Springs, CO (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 51 days.

(21) Appl. No.: 09/927,793

(22) Filed: Aug. 10, 2001

(65) Prior Publication Data

US 2003/0107401 A1 Jun. 12, 2003

(51) Int. Cl.[7] ............................................. H03K 19/177
(52) U.S. Cl. ........................................... 326/41; 326/38
(58) Field of Search ..................................... 326/37–41

(56) References Cited

U.S. PATENT DOCUMENTS

| | | | |
|---|---|---|---|
| 5,185,706 A | 2/1993 | Agrawal et al. | ............. 364/489 |
| 5,621,650 A | 4/1997 | Agrawal et al. | ............. 364/489 |
| 5,764,078 A | 6/1998 | Agrawal et al. | ............. 326/40 |
| 5,789,939 A | 8/1998 | Agrawal et al. | ............. 326/41 |
| 5,811,986 A | 9/1998 | Agrawal et al. | ............. 326/39 |
| 5,818,254 A | 10/1998 | Agrawal et al. | ............. 326/39 |
| 6,150,841 A | 11/2000 | Agrawal et al. | ............. 326/41 |
| 6,184,713 B1 | 2/2001 | Agrawal et al. | ............. 326/41 |

OTHER PUBLICATIONS

U.S. application Ser. No. 09/326,940 filed Nov. 22, 2002 by Om. P. Agrawal et al. entitled "Scalable Architecture for High Density CPLD'S Having Two–Level Hierarchy of Routing Resources".

Lattice Semiconductor Corporation data sheet: "5000V Family Architectural Description", Nov. 1999, pp. 1–7.

Primary Examiner—Don Le
(74) Attorney, Agent, or Firm—MacPherson Kwok Chen & Heid LLP; Gideon Gimlan

(57) ABSTRACT

An improved, high density CPLD includes a plurality of macrocell sections. Each macrocell section can receive a relatively large number of independent input terms and can generate as a base cluster, at least as many as 5 different product term signals (PT's) therefrom. Part or all of the macrocell's local 5 PT's may be used for generating a local sum-of-products (SoP) signal in a local, first-level ORring operation. Additionally SoP's generated in neighboring macrocell sections may be selectively and incrementally cascaded (cross-laced) for supplemental summing into the local SoP signal. SoP signals of neighboring sections may be further selected in a sums sharing array for second level summing. The combination of the first-level cascading (cross-lacing) and second-level sums sharing provides a wide range of programmably selectable granulations including that of having relatively fast generation of a sum of just a few PT's (e.g., ≦5 PT's) to having slower generation of sums of a much larger number of PT's (e.g., ≦160 PT's).

15 Claims, 15 Drawing Sheets

200
LEGEND

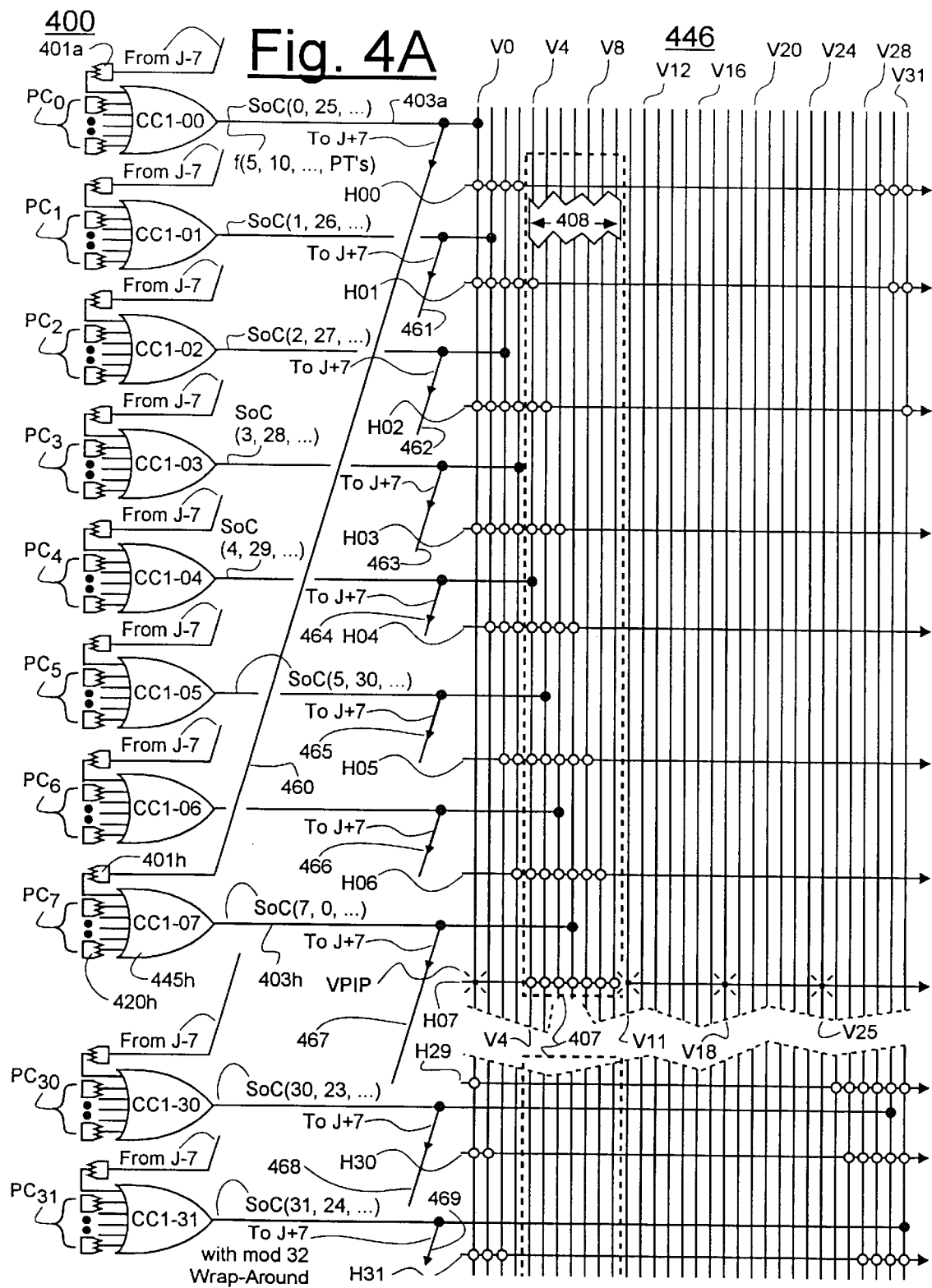

ENHANCED MACROCELL MODULE HAVING EXPANDABLE PRODUCT TERM SHARING CAPABILITY FOR USE IN HIGH DENSITY CPLD ARCHITECTURES

BACKGROUND

1. Field of Invention

The present disclosure is generally directed to monolithic integrated circuits, and more specifically to a repeated, product-term processor and macrocell module design for use within Programmable Logic Devices (PLD's). It is even more specifically directed to a product-term processor and macrocell module design as applied to a subclass of PLD's known as High-Density Complex Programmable Logic Devices (HCPLD's).

2a. Cross Reference to Related Applications

The following U.S. patent application is owned by the owner of the present application, and its disclosure is incorporated herein by reference:

(A) Ser. No. 09/721,153 filed Nov. 22, 2000 by Om P. Agrawal et al. and originally entitled, "SCALABLE ARCHITECTURE FOR HIGH DENSITY CPLD's HAVING TWO-LEVEL HIERARCHY OF ROUTING RESOURCES".

2b. Cross Reference to Related Patents

The disclosures of the following U.S. patents are incorporated herein by reference:

(A) U.S. Pat. No. 6,184,713 B1 issued Feb. 6, 2001 to Om P. Agrawal et al, and entitled, "SCALABLE ARCHITECTURE FOR HIGH DENSITY CPLD's HAVING TWO-LEVEL HIERARCHY OF ROUTING RESOURCES";

(B) U.S. Pat. No. 6,150,841 issued Nov. 21, 2000 to Om P. Agrawal et al, and entitled, ENHANCED MACROCELL MODULE FOR HIGH DENSITY CPLD ARCHITECTURES;

(C) U.S. Pat. No. 5,811,986 issued Sep. 22, 1998 to Om Agrawal et al, and entitled, FLEXIBLE SYNCHRONOUS/A SYNCHRONOUS CELL STRUCTURE FOR HIGH DENSITY PROGRAMMABLE LOGIC DEVICE;

(D) U.S. Pat. No. 5,764,078 issued Jun. 9, 1998 to Om Agrawal et al, and entitled, FAMILY OF MULTIPLE SEGMENTED PROGRAMMABLE LOGIC BLOCKS INTERCONNECTED BY A HIGH SPEED CENTRALIZED SWITCH MATRIX;

(E) U.S. Pat. No. 5,818,254 issued Oct. 6, 1998 to Om Agrawal et al, and entitled, MULTI-TIERED HIERARCHICAL HIGH SPEED SWITCH MATRIX STRUCTURE FOR VERY HIGH DENSITY COMPLEX PROGRAMMABLE LOGIC DEVICES;

(F) U.S. Pat. No. 5,789,939 issued Aug. 4, 1998 to Om Agrawal et al, and entitled, METHOD FOR PROVIDING A PLURALITY OF HIERARCHICAL SIGNAL PATHS IN A VERY HIGH DENSITY PROGRAMMABLE LOGIC DEVICE;

(G) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (H) U.S. Pat. No. 5,185,706 issued Feb. 9, 1993 to Om Agrawal et al.

2c. Reservation of Extra-patent Rights and Resolution of Conflicts

After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, the present disclosure controls. If such incorporated disclosures conflict in part or whole with one another, then to the extent of conflict, the later-dated disclosure controls.

3. Description of Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has grown along a is paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA may be generally characterized as a monolithic, integrated circuit that has an array of user-programmable, lookup tables (LUT's) that can each implement any Boolean function to the extent allowed by the address space of the LUT. User-programmable interconnect is typically provided for interconnecting primitive, LUT-implemented functions and for thereby defining more complex functions.

Because LUT-based function implementation tends to be functionally more exhaustive (broader) but speed-wise slower than gate-based (e.g., AND/OR-based) function implementation, FPGA's are generally recognized in the art as having a relatively more expansive capability of implementing a wide variety of functions (broad functionality) but at relatively slower speed. Also, because length of signal routings through the programmable interconnect of an FPGA can vary significantly, FPGA's are generally recognized as providing relatively inconsistent signal delays whose values can vary substantially depending on how partitioning, placement and routing software configures the FPGA.

A second evolutionary chain in the art has branched out along a paradigm known as Complex PLD's or CPLD's. This paradigm is characterized by devices such as the Lattice Semiconductor ispMACHT™ family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.) as well as in other CPLD patents cited above, including U.S. Pat. No. 5,811,986.

A CPLD device can be generally characterized as a monolithic, integrated circuit (IC) that has four major features as follows.

(1) A user-accessible, configuration-defining memory means, such as EPROM, EEPROM, anti-fused, fused, SRAM, or other, is provided in the CPLD device so as to be at least once-programmable (if not reprogrammable) by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of a CPLD device can be formed of a mixture of different kinds of memory elements if desired (e.g., SRAM and EEPROM). Typically it is of the nonvolatile, In-System reProgrammable (ISP) kind such as EEPROM.

(2) Input/Output means (IO's) are provided for interconnecting internal circuit components of the CPLD device with external circuitry. The IO's may have fixed configurations or they may include configurable features such as variable slew-output drivers whose characteristics may be fine tuned in accordance with user-provided configuration instructions stored in the configuration-defining memory means.

(3) Programmable Logic Blocks (PLB's) are provided for carrying out user-programmed logic functions as defined by user-provided configuration instructions stored in the configuration-defining memory means. Typically, each of the many PLB's of a CPLD has at least a Boolean sum-of-products generating circuit (e.g., an AND/OR array) or a Boolean product-of-sums generating circuit (e.g., an OR/AND array) that is user-configurable to define a desired Boolean function, —to the extent allowed by the number of product terms (PT's) or sum terms (ST's) that are acquirable and combinable by that circuit.

Each PLB may have other resources such as input signal pre-processing resources and output signal post-processing resources. The output signal post-processing resources may include result storing and/or timing adjustment resources such as clock-synchronized registers. Although the term 'PLB' was adopted by early pioneers of CPLD technology, it is not uncommon to see other names being given to the repeated portion of the CPLD that carries out user-programmed logic functions and timing adjustments to the resultant function signals.

(4) An interconnect network is generally provided for carrying signal traffic within the CPLD between various PLB's and/or between various IO's and/or between various IO's and PLB's. At least part of the interconnect network is typically configurable so as to allow for programmably-defined routing of signals between various PLB's and/or IO's in accordance with user-defined routing instructions stored in the configuration-defining memory means.

In contrast to LUT-based FPGA's, gate-based CPLD's are generally recognized by workers in the art as having a relatively less-expansive capability of implementing a wide variety of functions, in other words, not being able to implement all Boolean functions for a given input space, but being able to do so at relatively higher speeds. Wide functionality is sacrificed to obtain shorter, pin-to-pin signal delays. Also, because length of signal routings through the programmable interconnect of a CPLD is often arranged so it will not vary significantly despite different signal routings, CPLD's are generally recognized as being able to provide relatively consistent signal delays whose values do not vary substantially based on how partitioning, placement and routing software configures the CPLD. Many devices in the Lattice/Vantis ispMACH™ family provide such a consistent signal delay characteristic under the Lattice trade name of SpeedLocking™. The more generic term, Speed-Consistency will be used interchangeably herein with the term, SpeedLocking™.

A newly evolving sub-branch of the growing families of CPLD devices is known as High-Density Complex Programmable Logic Devices (HCPLD's). This sub-branch may be generally characterized as monolithic IC's that have large numbers of I/O terminals (e.g., Input/Output pins) in the range of about 50 or more (e.g., 64, 96, 128, 192, 256, 320, etc.) and/or have large numbers of result-storing macrocells in the range of about 200 or more (e.g., 256, 320, 512, 1024, etc.). The process of concentrating large numbers of I/O pins and/or large numbers of macrocells into a single CPLD device raises new challenges for achieving relatively broad functionality, high speed, and Speed-Consistency (SpeedLocking™) in the face of wide varieties of configuration software.

A more detailed discussion is provided in the above-cited U.S. application Ser. No. 09/721,153 concerning the various operations performed by CPLD configuring software. As such they will not be repeated here except to briefly note the following.

Configuration software can produce different results, good or bad, depending in part on what broadness of functionalities, what timing flexibilities, and what routing flexibilities are provided by the architecture of a target CPLD. The present disclosure focuses on the broadness of functionalities and timing flexibilities that are provided by repeated structures referred to herein as product-term processors and macrocell modules.

When confronted with a given design problem, CPLD-configuring software typically cycles through a series of phases, referred to commonly as 'partitioning', 'placement', and 'routing'. Differently designed CPLD's can have differently designed PLB's with respectively different, logic-implementing capabilities, and/or timing capabilities. Partitioning software may have to comply with certain, fixed floor-plan constraints placed on where certain functionalities are to be implemented, for example, next to a particular pin and/or pad whose location and use are pre-specified. Partitioning software has to account for the maximum size and speed of circuitry that each PLB is able to implement within the specific CPLD device that has been designated to implement the original and whole circuit design.

By way of example, each PLB of a given, first CPLD architecture may be able to generate in one pass (where the one pass does not include the use of a feedback loop) a sum-of-products (SoP) function signal of the expressive form:

$$f^N_{SoP.1} = \sum^{N} (PT_i^{Ki/Kmax/L}). \quad \{Exp. A\}$$

In this sum-of-products expression (Exp. A), the capital N factor represents a maximum number of product terms (PT's) that can be generated within, and thereafter summed by a respective PLB for defining the one sum-of-products function signal, $f^N_{SoP.1}$. (A PLB may be able to output more than one $f_{SoP}$ signal of course, each with its own N value and its own Ki value.) The Kmax factor represents in the same Exp. A, a maximum number of independent, PLB input signals that can be acquired from a set of L available lines extending besides the PLB. Ki is the number of actual signals that are used as a subset of Kmax for defining a corresponding, i-th product term, PTi. The acquired subset of Ki signals are ANDed together in the respective PLB to define each respective, i-th product term (PTi). If Ki=0, then PTi=0 and that PTi does not contribute to the Boolean sum.

In order to fit partitioning results inside the maximal $f_{SoP}$ capabilities of each PLB, the partitioning part of CPLD configuring software has to cast its primitive sums-of-products such that they are each equal to or less than the N-defined and Kmax-defined limits of the $f_{SoP}$ results that can be produced by respective PLB's of the targeted CPLD. If the architecture of the targeted CPLD is such that each of the above-described factors, N, Kmax and L (Exp. A) is relatively large, then the maximal $f_{SoP}$ results per PLB will tend to be relatively large and the design partitioning phase will be advantageously allowed to work with larger-sized, partition chunks. Less, inter-PLB routing resources will be needed. And that will make the job of the post-partitioning router easier. It will also tend to minimize the signal propagating delay through the CPLD because intra-PLB delays (due to routing within the PLB) tend to be smaller than inter-PLB delays (due to routing outside and between plural PLB's).

Designing a CPLD with the ability to only provide maximal $f_{SoP}$ results per PLB is not a good idea however. Silicon resources may be wasted and speed may be sacrificed if the to-be-partitioned, original design calls mostly for small chunks rather than PLB-consuming large chunks. So a judicious balance has to be struck between: (1) being able to make large the number, N, of summable product terms per sum-of-products function signal, $f_{SoP}$ output by a each programmable logic block (PT's/$f_{SoP}$/PLB) and (2) minimizing the die-space costs of implementing such a result, and (3) minimizing the signal-propagation delay created by such an implementation. This is not an easy task.

Besides being able to comply with pre-specified speed criteria, and pre-specified complexity-of-function specifications, users of CPLD's also usually want a certain degree of re-design agility (flexibility). Even after an initial design is successfully implemented by a CPLD, users may wish to make slight tweaks or other changes to their original design. The re-design agility of a given CPLD architecture may include the ability to re-design certain internal circuits without changing I/O timings. Re-design agility may also include the ability to re-design certain internal circuits without changing the placement of various I/O terminals (e.g., pins). Such re-design agilities are sometimes referred to respectively as re-design Speed-Locking™ and Pin-Retention (the former term is a trademark of Lattice Semiconductor Corp., headquartered in Hillsboro, Oreg.). The more generic terms of: 're-design Speed-Consistency' and 're-design PinOut-Consistency' will be respectively used herein interchangeably with 're-design Speed-Locking™' and 're-design Pin-Retention'.

In addition to speed, re-design agility, and full Boolean correctness, users of CPLD's typically ask for optimal emulation of an original design or a re-design in terms of good function packing density, low cost, low power usage, and so forth.

Some previous CPLD architectures meshed well with specific bus sizes of specific design problems. However, preferences tend to change over time. Industry standards may, at first, favor designs where address and data words have a size in the range of 8 to 16 bits. Industry standards may later migrate towards larger-sized organizations of signals such as address and data words having sizes in the range of 32 to 64 bits each.

A CPLD that has an architecture optimized for bus-oriented word sizes of 8 to 16 bits may not be able to efficiently accommodate designs where word sizes, and particularly, control word sizes, increase into a range of say, 32 to 64 bits. What is needed is an architecture that can efficiently accommodate dense design problems having word sizes in the range of 32 to 64 bits or more without losing speed and re-design agility. At the same time, if word sizes drop to a lower range for some supplied design problems, and workable solutions can be arrived at with use of relatively simpler circuit chunks, the flexible CPLD architecture should be able to make efficient use of resources that might otherwise go unused because of the drop to the smaller word sizes and/or to simpler partition chunks.

SUMMARY

An improved CPLD device in accordance with the present disclosure of invention includes a plurality of flexible, or variable-grain, product-term processors which each operate on a respective 'cluster' of at least 4 or 5 product term inputs (PTi's). The PT signals of these clusters can be summed locally in one step to provide a first, cluster-based, sum-of-products signal, $f^{N<6}{}_{SoP.1}$ whose production delay may be relatively small, but whose functional-complexity (e.g., N<6) is also relatively small. In accordance with the disclosure, expansion means are provided for producing in each product-term processor, a second, cluster-based, sum-of-products signal, $f^{N>5}{}_{SoP.2}$ whose production delay is somewhat larger than that of the first $f^{N<6}{}_{SoP.1}$ signal, but still fairly small, while its functional-complexity (e.g., N>5) can be made relatively larger.

Outputs of respective ones of the expansion means are cross-laced in a cascading manner into inputs of other expansion means at an interval (e.g., J+7) that fairly minimizes or avoids overlap of function-producing capabilities while allowing for continuous incremental build up of functional-complexity (e.g., N=10, 15, 20, 25, etc.) as longer sequences of the cross-lacing option are used. The outputs of the expansion means are further fed to a sums sharing array whose internal structure co-relates with the lacing interval chosen for the cross-lacing of the outputs and inputs of the plural expansion means. This and other aspects of the disclosure will become clearer from the below detailed description.

BRIEF DESCRIPTION OF THE DRAWINGS

The below detailed description makes reference to the accompanying drawings, in which:

FIG. 4A is a schematic showing an expansion and cross-lacing structure that may be used within the SLB structure of FIG. 3 in combination a sum-sharing array, shown in part in FIG. 4A;

DETAILED DESCRIPTION

Figure 1:
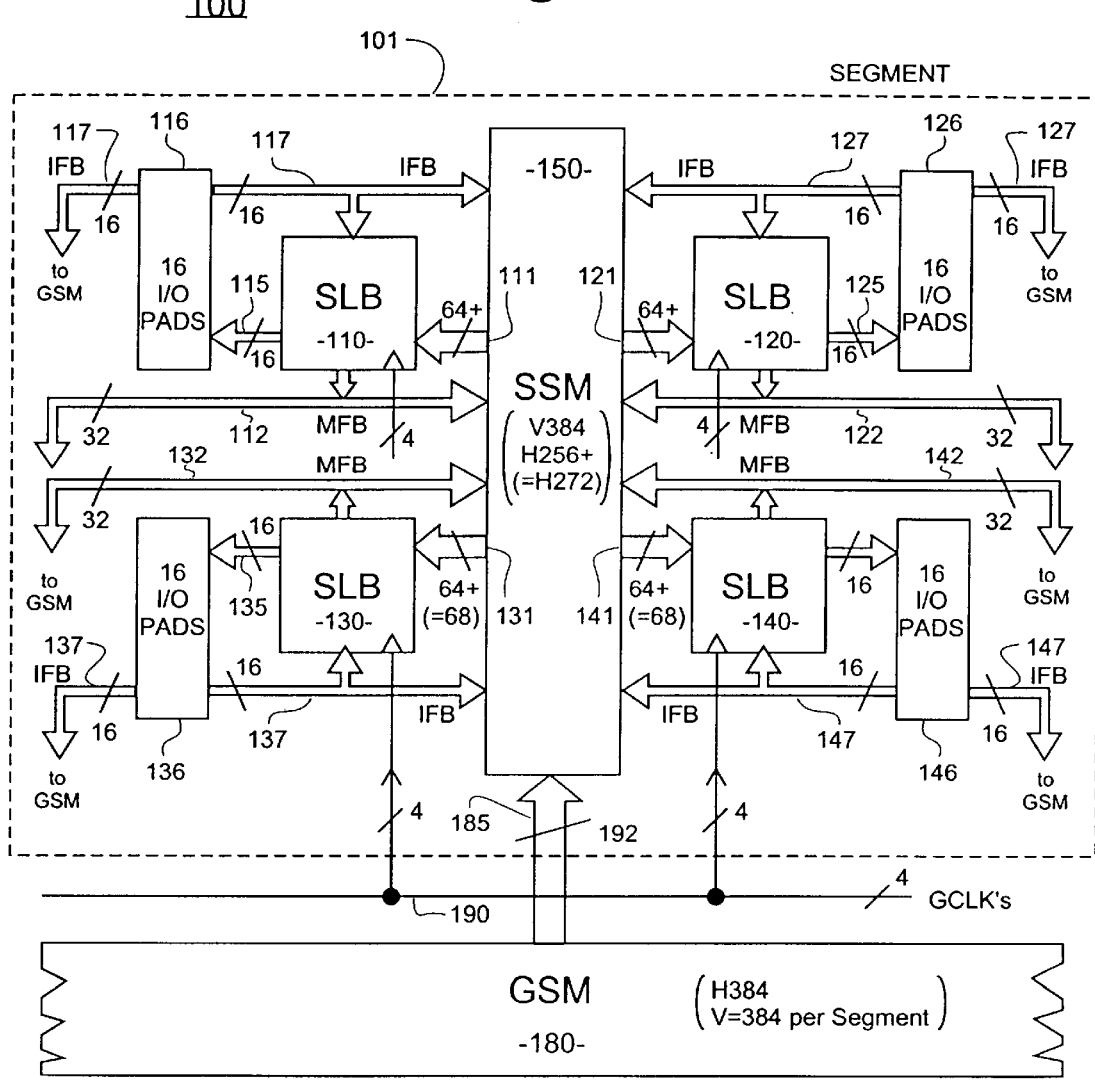
FIG. 1 is a block diagram showing a combination of one of plural CPLD 'Segments' and a 'Global Switch Matrix' (GSM) as may be used in a system in accordance with the invention, where the Segment has logic blocks (SLB's) organized internally per the invention.

A CPLD typically comes in the form of a monolithic integrated circuit that has a respective plurality of I/O pins or pads or the like for coupling to external circuits, such as by way of PCB traces provided on a printed circuit board (PCB). FIG. 1 provides an introduction to a scalable CPLD architecture 100 that may be used in accordance with the invention to interface with high density external circuitry by way of 50 or more I/O terminals (e.g., pads and/or pins).

The structure shown within dashed box 101 is referred to as a 'segment'. Although just one segment 101 is illustrated, it is to be understood that a CPLD in accordance with the invention may have a plural number of such segments, each coupled to a Global Switch Matrix (GSM, 180) in the manner shown.

In a central portion of the illustrated segment structure 101, there is provided a Segment Switch Matrix (SSM) 150. Symmetrically disposed about the SSM 150 there are an even number of programmable logic blocks, such as the illustrated four identical units which are each referred to herein as a Super Logic Block (SLB). The four SLB's are respectively designated here as 110, 120, 130 and 140. Corresponding and identical groups of 16 I/O terminals (e.g., buried pads or alternatively, externally-connected pads) each are provided respectively for SLB's 110, 120, 130 and 140. The I/O pad groups are respectively designated as 116, 126, 136 and 146.

It is seen from the broad overview of FIG. 1 that a 'segment' 101 is capable of inputting and/or outputting at least as many as 64 I/O signals simultaneously from the combination of I/O pad groups 116, 126, 136 and 146. The same arrangement 101 may alternatively be used for transceiving the signals of four separate, 16-bit wide buses or for transceiving the I/O signals of two, 32-bit wide buses. SSM 150 can be symmetrically organized to provide efficient operation for 64-bit wide bus operations, 32-bit wide bus operations, or 16-bit wide bus operations.

Referring to SLB 110 as an exemplary representative of the similarly-structured other three SLB's of segment 101, each SLB receives a first set of 64-plus (e.g., 68) input signals from the SSM 150. The first SLB input set for SLB 110 is identified as 111. Independent but essentially same SLB input sets of 64-plus signals each are available to each of the other SLB's 120-140 of the same segment 101 and are each carried by a respective, 64(plus)-bits wide bus. The SLB input buses of the other three blocks are respectively designated as 121, 131 and 141. If desired, the size of each of buses 111, 121, 131, 141 may be changed to other values that constitute a default word size such as 64 bits plus a control overhead amount such as 4 (64+4=68). In two respectively alternate embodiments, the size of buses 111, 121, 131, 141 is instead 72-bits wide (64+8=72) or 80-bits wide (64+16=80). Other appropriate values may be used.

The 64-plus bits carried by the 64-plus parallel lines of first input bus 111 can represent, by way of example, sixty-four simultaneous bits of data or address combined with simultaneous control signals (up to about 6% control overhead in the case where 68 lines are used). Thus if B is a number of parallel bits for a word in a given design that is to be implemented, each SLB can support parallel processing of B plus additional over head bits, up to the bit size of buses 111–141. Although in the illustrated segment design, B equals 64 bits, migrations to larger segment designs where B is 72, 96, 104, 128, and so forth are within the spirit of the present invention. Of course, die size may have to be increased and pin-to-pin delay may suffer if the number (B-plus) of SLB input lines per SLB increases without commensurate improvements in the underlying technology (e.g., without using smaller, lower voltage transistors, without using metal interconnect with lower resistivity such as copper, high-K dielectric, and so forth).

Each of the 64-plus lines of input bus 111 is a general purpose line that may be used for carrying any kind of input signal. The example that is given above regarding 64 address/data signals and up to 4 overhead control signals is merely an example to demonstrate how the architecture of segment structure 101 may be exploited to implement a circuit that corresponds to a 64-bit wide A/D bus and an associated 4-bit wide, overhead control bus. All of the 64-plus SLB input signals can be present at a same time as independent signals that are output from SSM 150 and are input through SLB input bus 111 into SLB 110 so that the 64-plus SLB input signals (111) can be simultaneously processed by SLB 110.

SLB 110 can produce 32 macrocell result signals where each is a sum-of-products function whose product terms (PT's) can each be a product of up to the full 64-plus, general purpose signals provided by input bus 111 or their complements. One or more of local control signals for specific macrocells (e.g., I/O_OE) and/or local control signals for specific blocks (e.g., SLB_RST) and/or local control signals for specific segment-wide control functions (e.g., SEG_RST) and/or global control signals for CPLD-wide, global control functions (e.g., GLB_RST) may be further formed from the 64-plus general purpose signals provided by input bus 111 if desired.

Registered and/or combinatorial result signals 112 produced by the 32 macrocells of each SLB (110) are also referred to herein as macrocell feedback signals or 'MFBs'.

In one embodiment (see FIG. 3), each MFB signal can take on the expressive form:

$$f_{SoP} = \sum_{}^{N=5++} (PT_i^{Ki/68max/(L=384/[24])}) \quad \{Exp. B\}$$

wherein the N=5++ factor indicates that a minimum-delay, one-pass sum can be a sum of at least as many as five product terms (5 PT's), but can be larger (e.g., 10, 15, 20 PT's) with use of parallel cross-lacing (described below, see FIG. 4A) and can be even larger (e.g., 70, 105, 140 PT's) with simultaneous use of sum-sharing (also described below, see FIG. 4B). In the expression, Exp. B, each product term, PTi can be a Boolean AND of as many as 68 independent input signals.

The Kmax=68 independent input signals of Exp. B can be obtained by sampling from a larger available set of 384 signals from an available set of L=384 lines. The '[124]' factor that divides into each of the L available lines indicates a level of partial-population that fills the crosspoint array formed by the intersection of the Kmax=68 lines (bus 111) of each SLB and the crossing L=384 lines of SSM 150. (See also item 353 of FIG. 3.) A corresponding routability factor is defined by, R=(Kmax=68 times [24] divided by 384 supply lines)=4.25 PIP's average per supply line.

Qualifier words used above, such as 'single-delay' will be detailed later. The N=5++ value can be raised to larger values such as N=70 or N=105 or larger by use of cross-lacing and sum-sharing.

In level-1 cross-lacing, the 5 PT's result of a first OR gate are summed with the 5 PT's result of a second OR gate, to thereby produce a functionally richer result based on 10 independent PT's. In a subsequent sum-sharing operation that result can be multiplied by a factor such as 7, thereby producing a single-pass result of effectively 70 independent PT's. However such chained cross-lacing and sum-sharing incurs additional gate delays. Each serial passage of a timing-critical, PT signal through more OR gates and/or larger sum-sharing arrays increases the ultimate delay of the resulting Sum-of-Sums. Thus the value, N=5++ can be much larger if the circuit designer is willing to tolerate more than a single quantum of delay.

Continuing with our overview of FIG. 1, MFB signals 112 may be fed back both to SSM 150 and to Global Switch Matrix (GSM) 180. If the delay of through-the-GSM or through-the-SSM feedback or cascading can be tolerated in a given design, then any one or more of the 64-plus inputs of SLB input bus 111 can itself be an MFB signal that was generated by the same SLB 110 and thereafter fed back through SSM 150 or GSM 180 for further, cascaded processing. Alternatively or supplementally, any one or more of the 64-plus inputs of SLB input bus 111 can be an MFB signal that was generated by another SLB (120-140) of the same segment (101) and thereafter forwarded by way of SSM 150 and bus 111 to SLB 110. As yet another variation, any one or more of the 64-plus inputs of SLB input bus 111 can be an MFB signal that was generated by another SLB in a different segment (not shown) of the CPLD and thereafter passed through the GSM 180, the SSM 150 and SLB input bus 111 to reach SLB 110.

As yet a further variation, any one or more of the 64-plus inputs of SLB input bus 111 can be an externally-produced I/O signal (an IFB signal 117). Up to 64 such externally-produced I/O signals can come in directly from the up-to 64 I/O pins (coupled via nonburied pads) of the illustrated segment 101 while up to another 16 such externally-supplied I/O signals per segment can come in from I/O pins of another segment.

SSM 150 has 384 vertical longlines (indicated in the drawing by 'V384'). These V384 lines of SSM 150 can simultaneously carry 5 separate sets of 68 independent signals each respectively for acquisition by the 4 SLB input buses 111, 121, 131 and 141 of SLB's 110, 120, 130 and 140. Note that the number of horizontal crosslines in SSM 150 is 256-plus (denoted as H256+). In the embodiment of SSM 150 where 64+ equals 68, H256+ equals 272.

The 32 MFB signals (e.g., 112, 122, etc.) that are respectively produced by the 32 macrocells of each SLB (110, 120, etc.) may be used to selectively generate a smaller subset of sixteen I/O signals. These 16, SLB-produced I/O signals may be provided on a tri-stated basis and by way of I/O bus 115 (125, etc.) to respective I/O pads 116 (126, etc.). Not all of the I/O pads 116 necessarily connect to an external package pin. some may instead be 'buried' pads.

One or more of the sixteen I/O signals on I/O pads 116 may be instead generated outside the CPLD and supplied into the chip by way of respective I/O pins that connect to nonburied ones of the I/O pads 116. The externally-sourced or internally-produced I/O signals may be transmitted by way of bus 117 from I/O pads 116 to SSM 150 and also to GSM 180. Bus 117 may also serve as a path by way of which externally-generated signals enter the CPLD through I/O pads 116 and then enter into the SLB 110 for synchronization before being forwarded via bus 112 or 115 to one or both of SSM 150 and GSM 180. In this latter transfer process, a data storing portion of SLB 110 may receive the externally-sourced I/O signals 117 for storage and subsequent output onto MFB bus 112 and/or I/O bus 115 as will be described below.

Although the above discussion has focused on SLB 110, it is to be understood that each of SLB 120, 130 and 140 has a similar arrangement of inputs and outputs which are referenced accordingly in FIG. 1. Furthermore, each of SLB 110, 120, 130 and 140 can receive four global clock signals (GCLK's) from a global clock bus 190.

It is seen from the above that SSM 150 receives 192 general purpose, global signals from GSM 180 by way of connection 185. Another 192 input signals of Segment Switch Matrix 150 are defined by a 100% intra-segment return of the four sets of 48 signals each produced by the MFB and IFB resources (buses 112, 117, 122, 127, 132, 137, 142, 147) of the corresponding SLB's 110-140. SSM 150 can be viewed as including a matrix of 384 vertical longlines (V-LL's) and 256+ crossing over, horizontal shortlines (H-SL's). The count of the 256+ shortlines is formed by the four sets of 64+ signals each output from the SSM 150 into respective SLB input buses 111, 121, 131 and 141. The crossed-lines matrix in SSM 150 of 384 vertical lines and 256+ horizontal lines is represented by the symbol, V384/H256+. This V384/H256+ matrix of crosspoints is preferably, partially populated by a similar set of PIP's (programmable interconnect points) so that each SSM local longline is generally, similarly loaded by a respective same number of PIP's, so that each SSM global longline is correspondingly and similarly loaded by a respective same number of PIP's, and so that each SSM shortline is similarly loaded by a respective same number of PIP's. Thus, for the illustrated embodiment, a respective and essentially same delay is provided by routing to any corresponding SSM output line (of buses 111, 121, 131, 141) either a respective signal from any SSM local input (e.g., 112, 117) or a respective signal from any SSM global input (185).

GSM 180 can receive up to 192 general purpose signals from each segment (e.g., 101), can output up to 192 general purpose signals to each segment (by way of bus 185), and can carry as many as 384 inter-segment signals. The H384/ (V384 per segment) matrix of crosspoints in GSM 180 is preferably, partially populated by a similarly distributed set of PIP's (programmable interconnect points) so that each GSM longline (horizontal) is loaded by a similar and generally same number of PIP's and each to-GSM inputting shortline (vertical) is respectively loaded by a similar and generally same number of PIP's and each from-GSM outputting shortline (feeds into bus 185) is respectively loaded by a similar and generally same number of PIP's. Thus an essentially same delay is provided by routing a signal from any GSM input to any corresponding GSM output.

One CPLD monolithic device 100 in accordance with the invention employs at least four layers of metal interconnect and transistors with drawn channel lengths of $0.35\mu$ or less and effective transistor channel lengths of $0.25\mu$ or less. The Vdd voltages of such $0.25\mu$ Leff transistors is typically 3.6V or less. The metal interconnect is used for longlines in switch matrices for reducing routing delays. The submicron transistors are used for defining PIP's (programmable interconnect points) having relatively short signal transmission times. Pin-to-any-other-pin delay time in CPLD 100 can be as short as about 10 nS to 5 nS (nanoseconds) or less. Intra-segment pin-to-any-other-pin delay time can be as short as about 5 nS or less. Such delays can vary depending on choice of technologies for implementing the integrated circuit (e.g., transistor channel lengths and doping profiles, aluminum versus copper for metal interconnect, low-k dielectric versus conventional silicon oxide, and so forth.)

In one particular embodiment, there are eight segments (not shown), respectively denoted as A–H, which are provided symmetrically about GSM 180. Each of segments A–H has 64 I/O pads and four SLB's. Some of the I/O pads may be buried ones (e.g., 32 per segment) while the others are connected to external pins. Each SLB contains 32, result-storing macrocells. The exemplified CPLD 100 therefore has a total of 512 I/O pads and 1024 macrocells. There are 128 fully-interconnectable macrocells within each segment. If the pad burial rate is 50%, there will also be 256 I/O pins for the IC device. The four global clock (GCLK) pins of the exemplified CPLD 100 are divided into two pairs. Two of the pins are coupled to programmably-bypassable phase locked loops (PLL's) which then couple to two chip-wide GCLK lines. The other two pins connect directly to two other chip-wide GCLK lines. The PLL's may be used for frequency multiplication and/or phase adjustment relative to chip-external clock signals.

Each of the mentioned eight segments, A–H may operate as an independent and self-contained mini-CPLD that has up to 64 I/O terminals and has 128 macrocells. The 384 longlines (horizontal lines) of GSM 180 may be used as substitute for a printed circuit board which can interconnect the total of 512 I/O pads (buried or not) of the 8 mini-CPLD's in a wide variety of ways.

Alternatively, the 192 output signals of a first Segment Switch Matrix (e.g., SSM_A) can be fully interconnected by way of the 384 H-lines of the Global Switch Matrix (GSM) 180 to the 192 global V-lines of any other Segment Switch Matrix (e.g., SSM_H) so that two segments can define a global-wise, fully interconnected, double-mini-CPLD. (The other 192 V-lines in each SSM can be used for fully-supporting local feedback.)

Alternatively, the 384 H-lines of GSM 180 may be used on a more sparing basis to couple certain selected MFB and/or IFB signals of any first Super Logic Block (e.g., SLB1_A) to serve as inputs for any other Super Logic Block (e.g., SLB4_H). CPLD configuring software determines how many such global interconnects can be made based on the interconnect flexibilities provided by the GSM 180 and SSM's A–H.

Figure 2A:
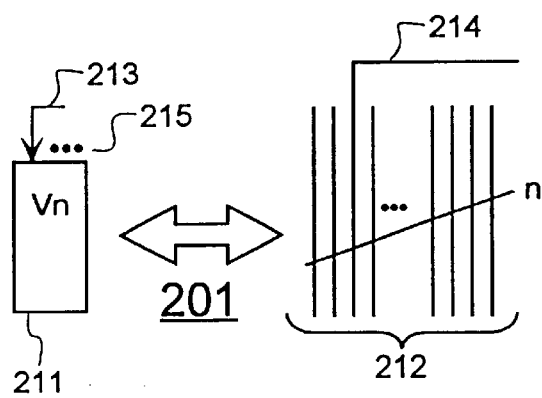
FIGS. 2A–2C provide a legend for various symbols used in others of the drawings.
Figure 2A:
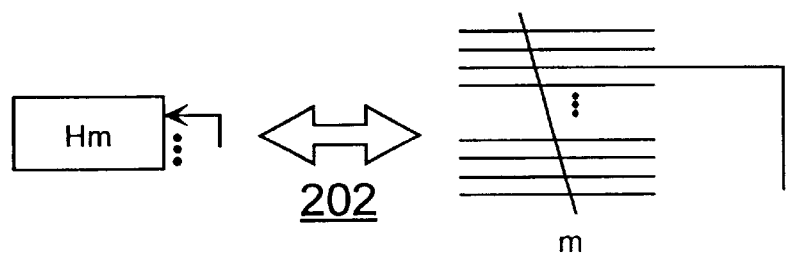
Figure 2A:
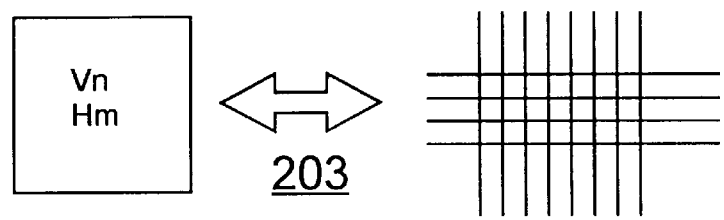
Figure 2A:
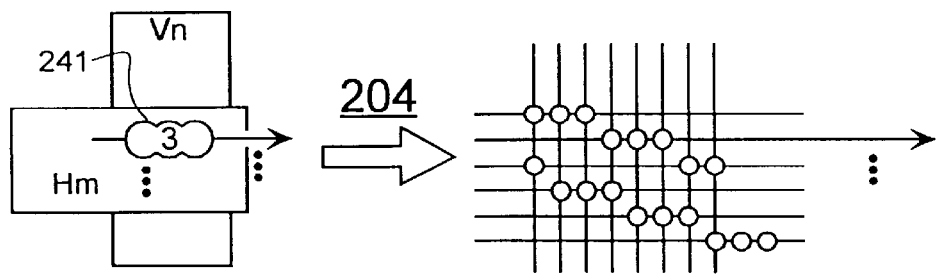
Figure 2B:
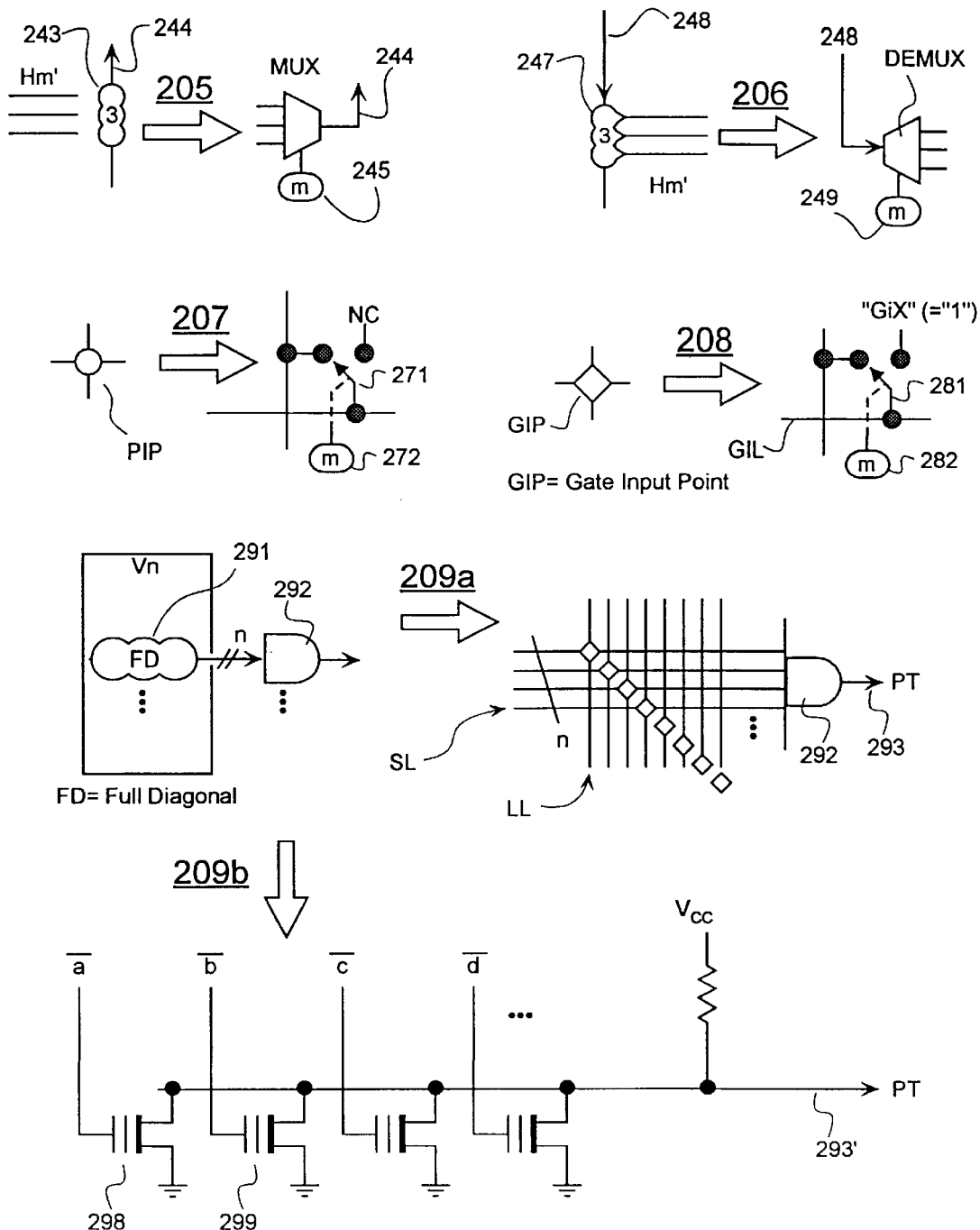
Figure 2C:
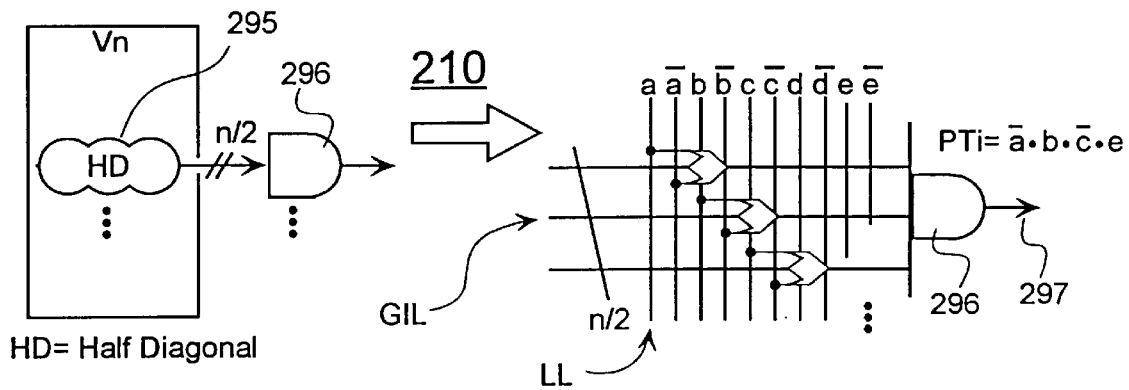
Figure 2C:
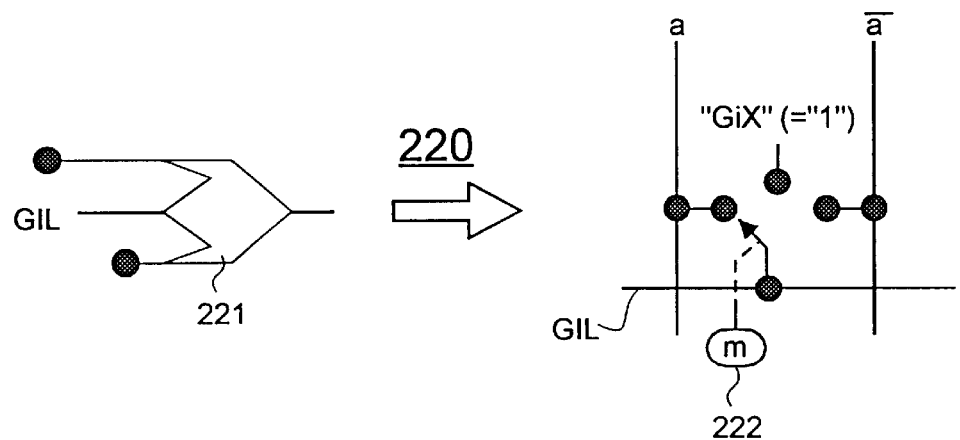
Figure 2C:
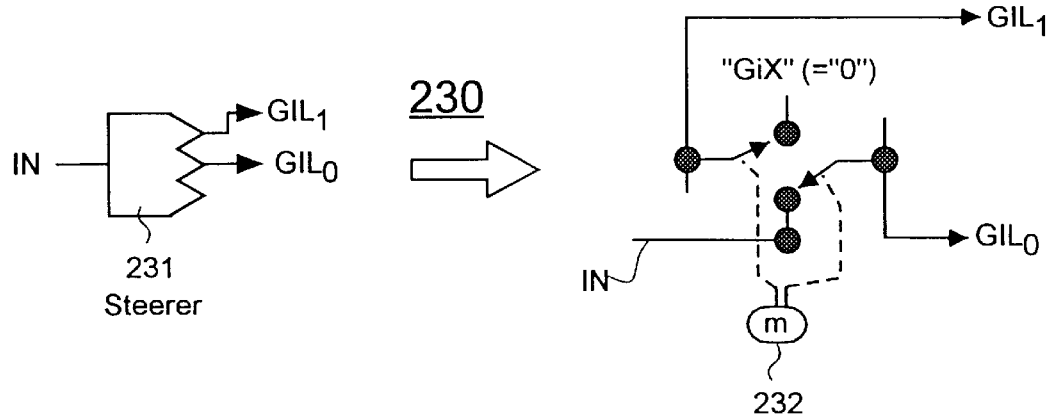
Figure 3:
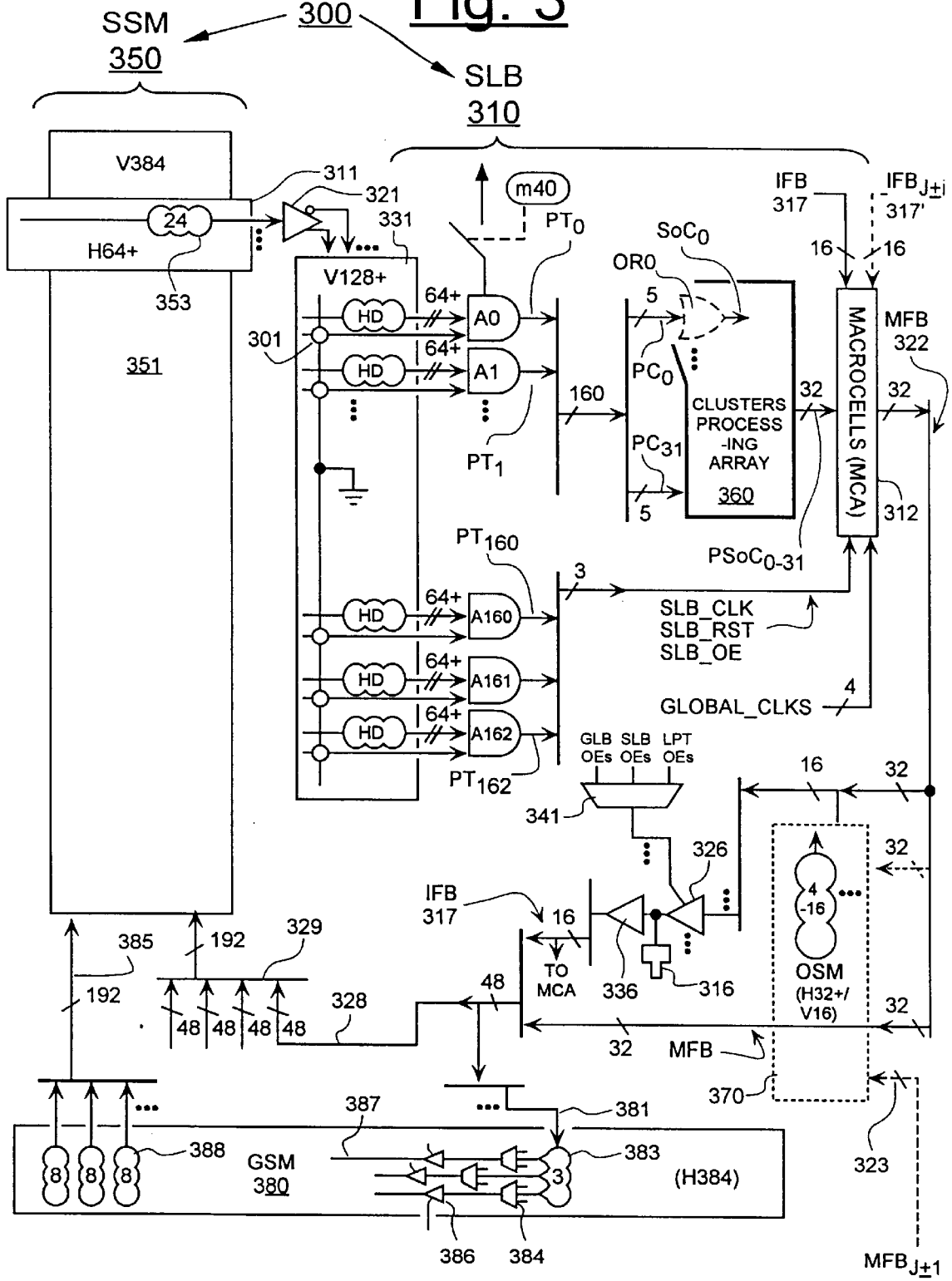
FIG. 3 is a schematic showing a 'Super Logic Block' (SLB) in accordance with the invention that contains a macrocell module per the present disclosure.

FIG. 3 demonstrates how local and global routing flexibility can be provided in the feedback loops of one embodiment 300 due to the provided combinations of switch matrix sizes and multiplexer sizes. However, before FIG. 3 is discussed, the meanings of various symbols therein are explained by referring to the legend 200 of FIGS. 2A–2C. Skilled practitioners may wish to skip past this part and continue their reading at the paragraph, 'Referring to FIG. 3 . . . '.

In legend FIG. 2A, interchangeability symbol 201 demonstrates that a rectangle 211 with insignia of the form 'Vn' in it represents (unless otherwise indicated) a set 212 of n parallel lines extending in the vertical (V) direction. The vertical (V) direction is that used in the respective drawing and does not in any way limit the direction or directions of extension of a given, actual bus even though that bus is described herein as being 'vertical'.

A particular one line such as 213 may serve as an exemplary representative of the n V-lines of a bus such as 211. The counterpart of the exemplary representative line 213 is shown as 214 in the schematic at the right of interchangeability symbol 201. An arrow may be used to indicate signal direction within the exemplary line 213. The ellipses 215 indicate that the example is understood to be repeated.

Interchangeability symbol 202 demonstrates that a rectangle with insignia of the form 'Hm' in it represents (unless otherwise indicated) a set of m parallel lines extending in the horizontal (H) direction. The horizontal (H) direction is that used in the respective drawing and does not in any way limit the direction or directions of extension of a given bus that is described herein as being 'horizontal'. Of course, when a horizontal first bus Hm crosses with a vertical second bus Vn, a corresponding set of m times n crosspoints will be defined in the actual device. The presence of a crosspoint by itself does not imply that an electrical connection is present there or can be programmably created at that crosspoint. However, as is explained shortly, a set of crosspoints can be fully or partially populated by PIP's (programmable interconnect points) to thereby define a programmable switch matrix.

Interchangeability symbol 203 demonstrates the equivalence between a rectangle with insignia of the form 'Vn/Hm' in it, and a crossing of a Vn bus with an Hm bus.

One-way interchangeability symbol 204 shows the formation of a partially populated, programmable switch matrix at the intersection of a Vn bus and a Hm bus. A peanut-shaped symbol such as 241 with a number in it, represents an exemplary set of partially populating PIP's. In this example a horizontally-extensive pattern of 3 PIP's is repeated vertically in a staggered and wrap-around manner so that in general, each H-line is loaded by same number of PIP's (e.g., 3) and each V-line is loaded by a same, vertically-associated number of PIP's (e.g., 2).

The routing function of the peanut-shaped symbol 241 can vary based on whether signal flow is bidirectional or unidirectional. One-way interchangeability symbol 205 (FIG. 2B) shows a case where each 3:1 peanut symbol 243 represents a 3-to-1 multiplexer (MUX) because signal flow is defined by 3 input signals (Hm') and one output signal 244. Configuration memory 245, and the selection control port that memory 245 connects to, may be implied.

One-way interchangeability symbol 206 shows a case where each 1:3 peanut symbol 247 represents a 1-to-3 demultiplexer (DEMUX) because signal flow is defined by 3 output signals (Hm') and one input signal 248. Configuration memory 249 and the selection control port are implied.

One-way interchangeability symbol 207 shows how a PIP (represented by a hollow circle) might be implemented by a configuration-memory controlled switch 271. In one state, the PIP creates either a unidirectional or bidirectional connection between the crossing H and V-lines. In a second state, the PIP does not provide a connection between the crossing H and V-lines. Switch 271 may defined by any one of a plurality of elements, such as an NMOS pass transistor, a CMOS transmission gate, a blowable fuse or makeable anti-fuse, one or an opposed pair of tristate drivers, and so forth. Configuration memory 272 can be discrete from controllable switch 271 or an integral part of it, such as when switch 271 includes a floating gate transistor and the charge on the floating gate defines a configuration memory state.

One-way interchangeability symbol 208 shows a GIP (a Gate Input Point which is represented here by a hollow diamond) might be implemented by a memory controlled switch 281. In one state, the GIP creates a unidirectional connection between a crossing signal-providing line and a gate input line (GIL). In a second state, the GIP instead couples the gate input line (GIL) to a Gate-input doesn't-care state 'GiX'. If the gate on the output end of the GIL is an AND gate, then the don't-care state 'GiX' is a logic '1' because that allows other inputs of the AND gate to define its output. If the gate on the output end of the GIL is an OR gate, then the don't-care state 'GiX' is a logic '0' for similar reasons. Switch 281 may defined by any one of a plurality of elements, such as an NMOS pass transistor with pull-up, a blowable fuse or makeable anti-fuse with pull-up, an open collector driver or a tristate driver with pull-up, and so forth. Memory 282 can be discrete from controllable switch 281 or an integral part of it, such as when switch 281 includes a floating gate transistor and the charge on the floating gate defines a memory state.

One-way interchangeability symbol 209a demonstrates for purpose of understanding symbolic equivalence, the relationship between a Vn rectangle with a Full-Diagonal symbol (FD peanut) 291 and a corresponding matrix of crosspoints that are populated by GIP's. The output 293 of AND gate 292 defines a product term (PT) of one or more of all n signals provided by the vertical longlines (V-LL's). The real or theoretical lines that cross with the V-LL's are sometimes referred to herein as shortlines (SL's) even though SL's might be longer than their LL's. Typically, LL's broadcast a set of available signals along an array of SL's. PIP's or GIP's on the SL's may be provided for selecting a subset of the LL-broadcast signals and for delivering the selected subset to an array of subsequent circuits (e.g., AND gates) provided along the longlines.

Those skilled in the art will recognize that the depiction to the right of symbol 209a is generally more symbolic than real. One-way interchangeability symbol 209b demonstrates a more realistic implementation of an n-inputs AND gate. Here, the product term signal 293' is formed by a wired-AND circuit having a pull-up resistor. The pull-up resistor can be an implied feature of a sense amplifier that inputs line 293' and skews the sense amplifier output towards high if the level on line 293' is above an appropriate threshold value. Speed of the wired-AND circuit tends to be related to the power drawn by the pull-up resistor and/or sense amplifier (latter not shown). If the RC of the wired-AND circuit is increased to conserve power (by increasing R), the response delay time of the circuit also increases. Each of NMOS floating gate transistors such as 298, 299, etc. receives a respective and pre-complemented one of the n input signals at its gate while its source is tied to ground and its drain is tied to pulled-up line 293'. If one of the pre-complemented input signals goes high, its transistor pulls line 293' low and thereby performs the Boolean ANDing function. Charge may be programmably and individually stored onto the floating gate of each of transistors 298, 299, etc. to define whether that crosspoint is active or not. If none of transistors 298, 299, etc. are active, then the pull-up resistor or its equivalent will pull the output of line 293' high to Vcc. In some cases the ANDing function may be sped up by cascading a parallel plurality of AND gates into a second level AND gate so that input loading in the first level is reduced. The cost, of course, is that cascading through the series of first and second level AND gates itself increases signal propagation time. Per DeMorgan's theorem, the AND-AND gate series may be replaced by a NAND-NOR gate series or other like equivalents.

In some instances, it is not desirable to use a Full-Diagonal (FD) of crosspoint populating GIP's such as implied by FD peanut symbol 291. For example, if each input signal and its 1's complement are simultaneously presented for input into a gate, then the theoretical number of gate input lines (GiL's) can be cut in half because both of the gate input signal and its complement will generally not be applied at the same time to a same AND gate or a same OR gate. Such a condition is illustrated to the right of interchangeability symbol 210. Each of the illustrated, hollow bird symbols (221) represents a memory-controlled, 3-to-1 switch that couples the GiL either to supplied input signal or its complement or to a Gate-input don't care level (Gix). The HD insignia at 295 represents such a Half-full Diagonal condition. The output 297 of AND gate 296 can be configured by the three-way switches (221) to be a product of any desired ones of the supplied input signals (a, a-NOT, b, b-NOT, etc.).

Those skilled in the art will recognize that the depiction to the right of 210 is generally more symbolic than real. One-way interchangeability symbol 209b again demonstrates a more realistic implementation. For the HD embodiment, additional and like-connected transistors will typically be added onto line 293' to receive the non-complemented signals, a, b, c, d, etc. The n number of vertical input lines will therefore be twice as many as the up to n/2 number of terms that may be ANDed together by the circuit. This relationship between the Vn input lines and the n/2 independent terms that may be ANDed is indicated in FIG. 4C to the left of leftmost gate symbol 296 by the double-slash symbol and its 'n/2' descriptor. A single, wired-AND circuit may be replaced by a cascaded series of smaller AND gates (or NAND-NOR's) as may be appropriate.

One-way interchangeability symbol 220 shows how a three-state switch 221 might be formed so configuration memory 222 determines whether input signal 'a' or 'a-NOT' or a don't care level (GiX) is applied to the gate input terminal line (GiL). If the receiving gate is an AND gate, then GiX='1'. At least two memory bits are generally needed to define the 3 states.

Those skilled in the art will recognize that a pair of transistors such as 298, 299 in the implementation shown below 209b can be used with a pull-up or pull-down resistor to emulate the operation implied at 220. For example, if an AND gate is being implemented, input signals a and a-bar (a-NOT) will be supplied respectively to the gates of transistors 298, 299. Three configuration memory states can be defined by disabling only 298 (receives 'a'), disabling only 299 (receives 'a-bar'), and disabling both of 298 and 299. If a fourth memory state is allowed where both of 298 and 299 are enabled, then the output 293' of the AND gate will be forced to zero because at least one of 'a' and 'a-bar' is zero.

Shown to the left of the next, one-way interchangeability symbol 230, there is a crown-shaped symbol 231 that represents the inverse of the operation performed by gate-input element 221. The crown-shaped symbol 231 represents a one-to: as-many-as-N-points, programmable steering switch that has one input point (IN) and a plurality of N output points (2 active ones in this example). Steering switch 231 is programmable to steer its input signal (IN) to at least one, programmably-selected one of its N output points while applying a predefined default level to each of the remaining of its N output points that are not specifically selected for receiving the input signal (IN). In other words, those of the N output points to which the IN signal is not specifically steered, will instead receive a respective default level (e.g., a GiX level).

In the illustrated example of one-way interchangeability symbol 230, the two (N) output points of steering switch 231 are respectively, a first input terminal ($GIL_0$) of a first gate (not shown) and a second input terminal ($GIL_1$) of a separate second gate (not shown). Both of the first and second gates (not shown) have a same, input don't care level (GiX). For example, if the first and second gates (not shown) are OR gates, then GiX is a logic '0' and that becomes the default output level of the corresponding steering switch 231. Thus, if configuration memory 232 can only select a specific one of the N output points, say the first input terminal ($GIL_0$), then steering switch 231 will steer the input signal (IN) to $GIL_0$ while steering the don't care, default level (GiX) to the input terminal ($GIL_1$) of the second gate. If configuration memory 232 instead selects $GIL_1$, then the vice versa operation will be performed. The input signal (IN) will be steered to $GIL_1$ while GiX will be steered to $GIL_0$.

If desired, configuration memory 232 can be made larger such that it can programmably-select more than one of the N output points of the steering switch 231 while applying a default level to the remaining of its N output points. In the illustrated example therefore, configuration memory 232 might be organized as two bits instead of one, in which case memory 232 can be programmed to control each of the illustrated SPDT electronic switches independently. Typically, in CPLD's where pass transistors may be used for implementing PIP's, and where configuration memory can be become excessively large if some restraint is not used, the configuration memory 232 of a steering switch 231 should be limited to selecting just one of the N output points. One reason why it is desirable to steer the input signal (IN) to the input terminal of only one gate at a time is so that speed can be maintained without having to provide too large of a signal generating driver (not shown).

Referring to FIG. 3, the illustrated super structure 300 is constituted by a Segment Switch Matrix (SSM) 350, and a cooperating part of Global Switch Matrix (GSM) 380, and a plurality of Super Logic Blocks, of which only SLB 310 is shown. Where practical, reference numerals in the '300' century series are used in FIG. 3 to refer to elements that have corresponding counterparts in FIG. 1, where the latter are identified by reference numerals in the '100' century series.

As such, the illustrated set 311 of 64-plus H-lines that emerge from SSM 350 represent the SLB input bus 311 for SLB 310. The illustrated set 322 of thirty-two MFB lines that emerge from macrocells area 312 carry the macrocell result signals (MFB's) of SLB 310. Pad 316 is a representative one of the 16 I/O pads of SLB 310. Alternate embodiments could of course have more or less I/O pads per SLB. All or a preselected subset of the I/O pads 316 may be buried if desired. The 16-bitlines wide bus 317 corresponds to bus 117 of FIG. 1 and includes a connection to macrocells area (MCA) 312. IFB bus 317 merges into a 48-bitlines wide, combined feedback bus 328. Combined feedback bus 328 then merges into a 192-parallel-bits wide, combined feedback bus 329 which feeds into Segment Switch Matrix (SSM) 350.

SSM 350 is constituted by a V384 section of longlines 351 crossing with respective H64+ shortlines that define corresponding SLB input buses (only one of plural H64+ sets is shown at 311). The V384 section of longlines 351 is divisible into a local-feedback portion (fed by bus 329) and a global-feedback portion (fed from the GSM by bus 385). On each H-line of SLB input bus 311 there may be provided a partially-populating pattern of PIP's that define a 24-to-1 multiplexer (24:1 mux) 353. The 24 PIP's of each such mux 353 are provided in the cross area of H64+ bus 311 with the V384 longlines of lines of section 351.

In the embodiment where H64+ is H68, there are 24×68= 1632 PIP's in the cross area of H64+ bus 311 and V384 section bus 351. Because the PIP's are generally uniformly distributed in this cross area, the 1632 PIP's provide, on average, 4.25 ways (1632/384) for a given signal on V384 bus 351 to enter SLB 310.

Up to the 64-plus number of, independent, SLB input signals may be carried by H64+ bus 311 into SLB 310. The SLB input signal on each of the H64+ lines may be chosen from among a respective 24 of the 384 signals carried by the longlines of SSM 350. Each of the H64+ lines is loaded by the electrical capacitance of its respective 24 PIP's plus the electrical capacitance of the one SSM longline to which one of multiplexers 353 programmably couples the SSM shortline. Each of the V384 longlines of SSM 350 is loaded by the electrical capacitance of its 4.25 on average PIP's per SLB times the number of SLB's in the given segment structure.

The 64-plus, independent, SLB input signals of bus 311 are supplied to a corresponding set of 64+ complementary line drivers. Element 321 is an example of one such complementary line driver. The V128+ output lines of the 64+ complementary line drivers (321) enter area 331 to cross with 163 HD structures. Each HD (Half Diagonal) structure of area 331 can supply a theoretical number of as many as 64+ independent input signals to a respective one of one hundred sixty three AND gates, A0 through A162. Additionally, a nulling PIP 301 may be provided in reality or theory for each of AND gates, A0–A162 for forcing the output its respective AND gate to zero. In general practice, the nulling PIP 301 will not be used, and instead one of the memory-controlled, 3-to-1 switches 221 (FIG. 2C) of each HD peanut may be replaced by a 4 state switch that further allows both a PT input term and its complement to be simultaneously applied to a respective pair of GiL's of the respective AND. Simultaneous application of the input term and its complement will force a zero output. This approach has been discussed above with respect to transistors 298 and 299.

Each of AND gates, A0 through A162 produces a respective one of product term signals, $PT_0$–$PT_{162}$. Alternate embodiments can of course have different numbers of such AND gates. Each respective product term, $PT_i$ can represent the Boolean product of one or more of any of the 64-plus SSM signals acquired by SLB input bus 311 or their corresponding complements. Each respective product term, $PT_i$ can also be set to logic '0' if no input term is selected by the respective HD structure of crosspoint area 331 and if the respective nulling PIP 301 or its equivalent is activated. Each respective product term, $PT_i$ can also be set to logic '1' if no input term is selected by the respective HD structure of crosspoint area 331 and if the respective nulling PIP 301 or its equivalent is not activated.

To conserve power, each SLB (e.g., 310) may include a programmably-controllable power switch that is driven by a corresponding configuration memory cell such as m40. If the product terms, $PT_0-PT_{162}$ of the given SLB are not needed, m40 is left in its programming default state and the pull-up resistors and/or sense amplifiers of AND gates, A0–A162 are thereby placed in a zero or minimal power-consumption mode. OE signals of below-described, drivers 326 may be simultaneously placed in output disabling states by this mechanism. However, pad input buffers 336 (also described below) should remain usable so that I/O pads 316 of the powered-down SLB may be loaned to other SLB's for signal inputting purposes. In another embodiment, rather than having one power-conserving means such as m40 operate on all of AND gates A0–A162 at once, the gates are grouped into clusters of five apiece (or another suitable subset) and an individual power-conserving is provided for each such cluster of AND gates. In yet another embodiment, individual power-conserving means such as m40 are provided to selectively operate on individual ones of AND gates A0–A 162.

A first subset of 160 of the product terms, $PT_0 14 PT_{159}$ are subdivided into 32 groups or 'clusters' of 5 PT's each, and supplied for processing by a clusters processing array 360. One operation that may be performed in clusters processing array 360 is to supply each of product term clusters PC$_0$–PC$_{31}$ to a corresponding one of 32, 5-input OR gates, OR0–OR31 (for brevity, only OR0 is shown). Each of OR gates, OR0–OR31 can then produce a respective one of 32 sum-of-cluster signals, SoC$_0$–SoC$_{31}$ (for brevity, only SoC$_0$ is shown). Each of the SoC$_0$–SoC$_{31}$ signals can therefore be expressed by the expressive form:

$$f_{SoC} = \sum^{N=5} Xi \cdot (PTi^{Ki/Kmax=64+/L=384}) \quad \{Exp. B1\}$$

where Xi=0 if the corresponding nulling PIP 301 is activated, Xi=1 otherwise, and PTi=1 if Ki is a null subset of Kmax.

For many applications, appropriate control signals or the like may be formed by the ORring of just five or less product terms as is represented by above Exp. B1. However, there still remain a significant number of applications that call for more complex, sum-of-product functions where the number, N of PT's participating is greater than 5. Clusters processing array 360 includes means for incrementally increasing the respective number, N of PT's participating in respective ones of the Processed Sum-of-Cluster(s) signals PSoC$_0$–PSoC$_{31}$ produced thereby from the supplied, product term clusters PC$_0$–PC$_{31}$. In one embodiment, N may be incrementally stepped through values such as 5, 10, 15, etc. as well as 35, 70, 105, etc. as will be seen. A logical OR of the full 160 product terms, $PT_0-PT_{159}$ may be produced if desired.

Figure 4B:
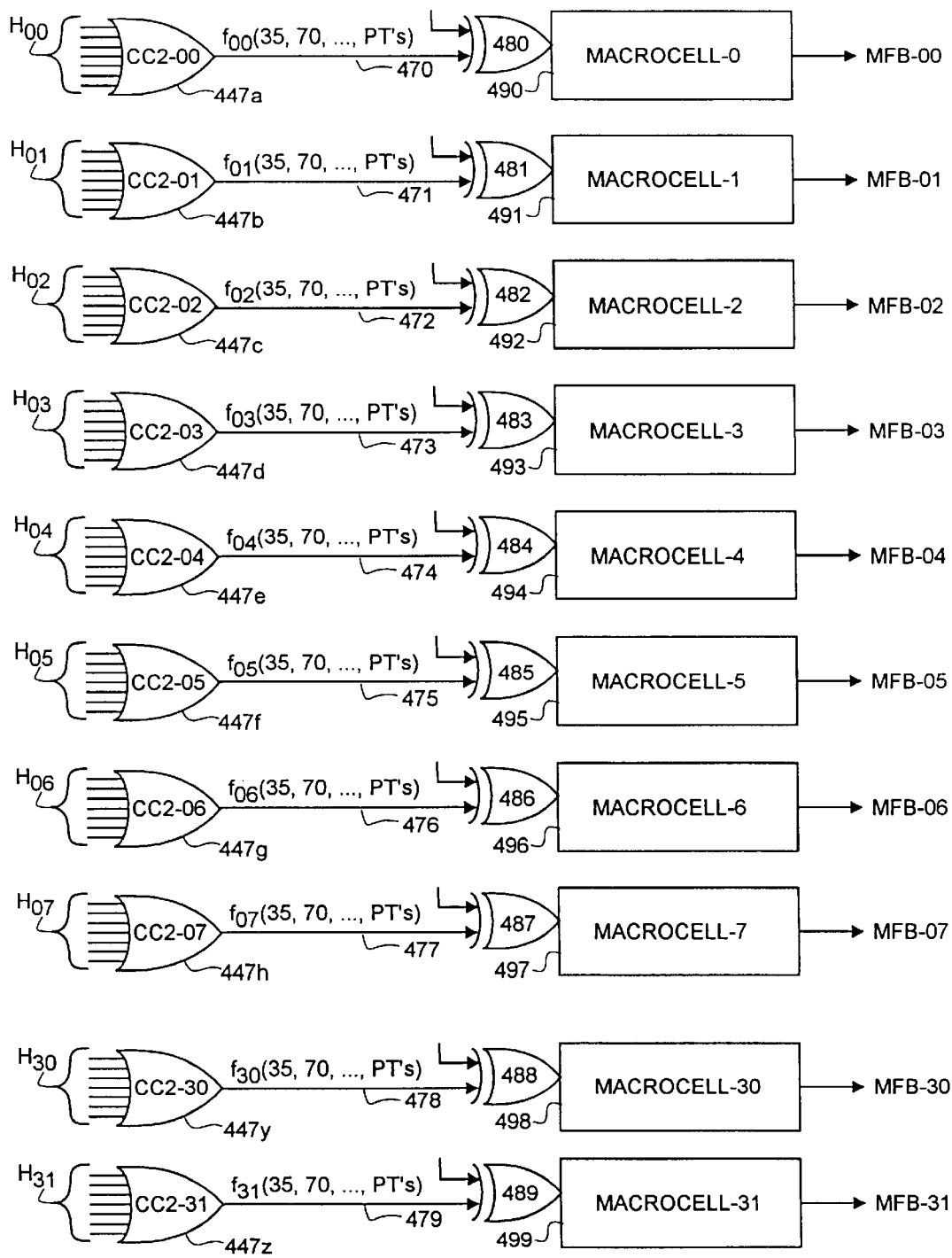
FIG. 4B is a schematic showing a further part of the sum-sharing array of FIG. 4A together with subsequent macrocell modules.
Figure 4C:
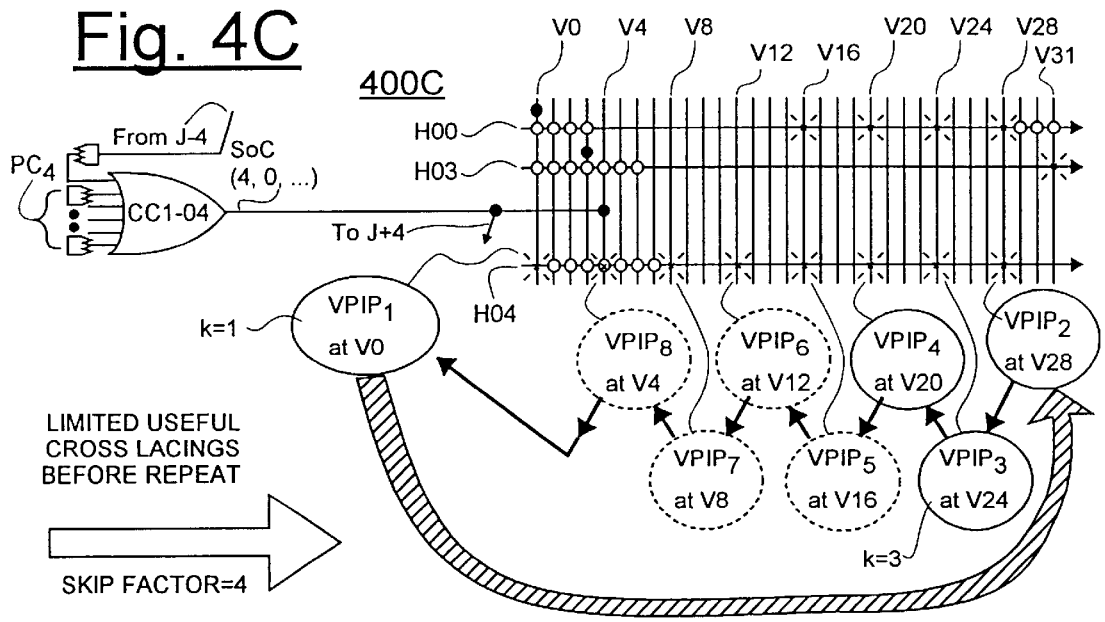
FIG. 4C is a schematic which explains consequences of using a J+4 cross-lacing skip factor.

Each of the 32 macrocells in macrocells area (MCA) 312 may comprise an XOR gate (see 480 of FIG. 4B, 551 of FIG. 5) that can dynamically define the polarity of its respective sum-of-products signal (see 470 of FIG. 4B). In accordance with DeMorgan's well known theorem, inversion of a Boolean sum (e.g., $PSoC_i$) causes it to appear as a product of its complemented terms and vice versa. Each of the 32 macrocells will typically further comprise a storage unit for storing the polarity-adjusted $PSoC_i$ signal. The storage unit can be fixed or may be of a programmably configurable type (see 560 of FIG. 5) that can be programmed to behave as anyone of, for example, a D-type flip flop with single or dual edge triggering, a T-type flip flop (toggling on appropriate clock edge or flat), a latch, or a combinatorial pass-through device that passes its input to its output without delaying for carrying out a storage function.

Figure 5:
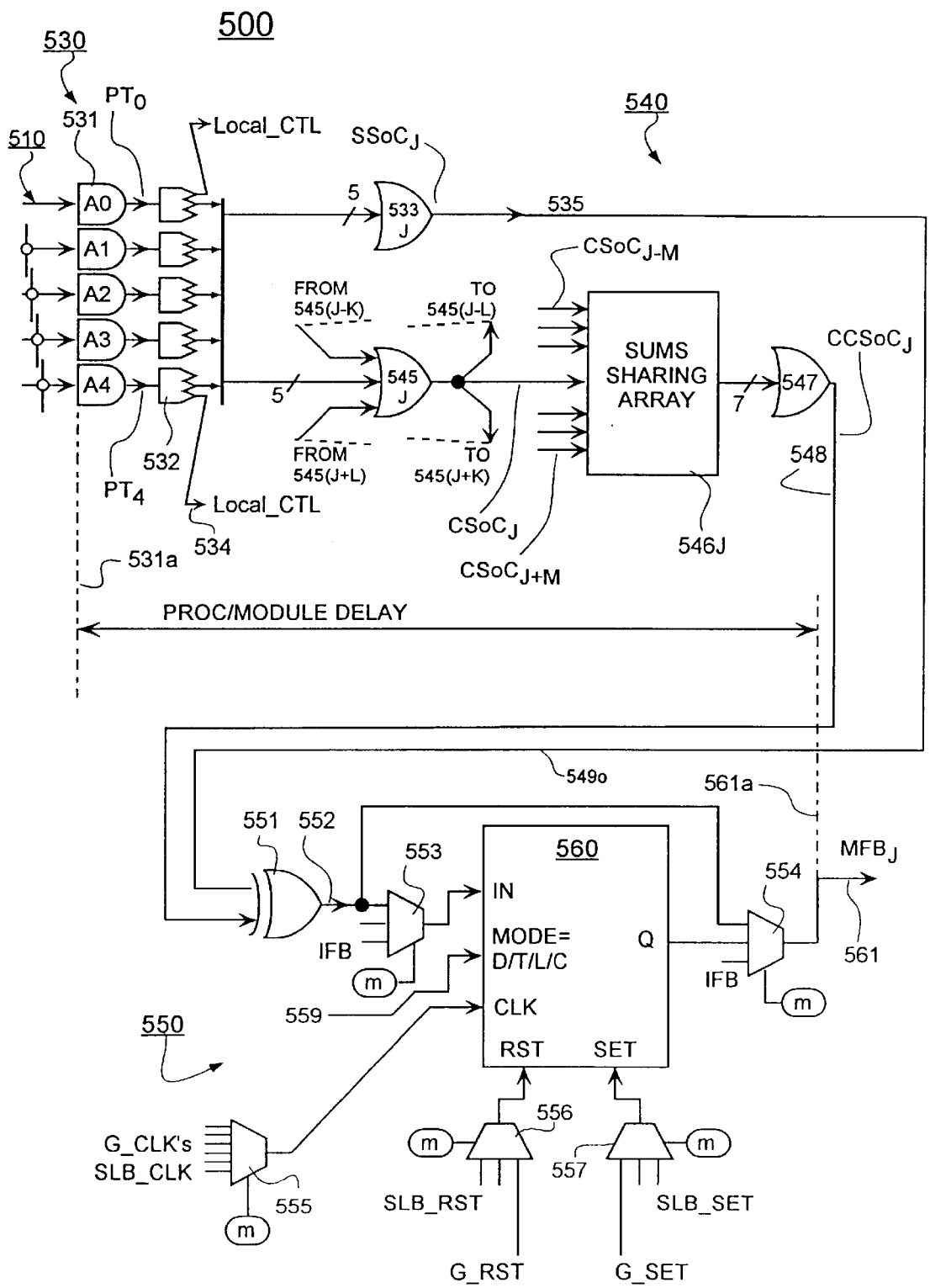
FIG. 5 is a schematic depicting a set of structures for cluster processing and macrocell modules that may be used within the SLB structure of FIG. 3.

FIG. 5 shows a generic first example of a combination 500 of a clusters processing module 540 and a macrocell module 550 that may be provided in accordance with the invention. Clusters processing module 540 receives its respective set of five, clustered product term signals, $PT_0-PT_4$ from an input term signals acquiring means 510 (e.g., area 351 of FIG. 3), and a corresponding AND gates array 530. The acquired product term signals are processed by processing module 540 and thereafter submitted for optional storage in and/or output from, macrocell module 550. As used herein, the term, 'combined module delay' refers to the time delay between when valid input terms (product-forming signals) appear at an input boundary 531a of a processor's AND array 530 and when a corresponding, valid macrocell output signal, MFB$_J$ appears at output boundary 561a of a macrocell module 550. As will be understood shortly, boundaries 531a and 561a do not necessarily have to be in a same macrocell module. One module may acquire input signals while another produces a corresponding, macrocell output signal, MFB. Delays attributed to PIP's and switch matrix lines in the input term signals acquiring means 510 are not counted as part of the combined module delay Similarly, delays attributed to PIP's and switch matrix lines in each Pad Output Switch Matrix (POSM, see optional matrix 370 of FIG. 3) are not counted as part of the combined module delay. In one embodiment, the combined module delay can be as short as 3 nS or less if cross-lacing and sums-sharing is not employed.

Storage macrocell module 550 and the remainder of circuit 500 constitute a Jth one of an array of like circuits that are sequentially numbered, as for example in the sequence, J−3, J−2, J−1, J, J+1, J+2, J+3, etc.

The AND 530 comprises a first array 531 of five AND gates, A0–A4 that respectively generate product term signals, PT0–PT4. The AND 530 feeds a second array 532 of up to five PT-steering elements. The latter drive a first OR gate 533J which generates a respective, 'simple' sum-of-cluster signal, SSoC$_J$, where the latter can be sum of as many as 5 PT's , namely, PT0–PT4 of the local cluster, J. However, if one or more of the PT-steering elements 532 is activated to steer (steal) its respective PT signal away from the first OR gate 533, then the simple sum-of-products signal, SSoC$_J$, will be a sum of a fewer number of the locally-acquired product terms than 5 PT's .

The five PT-steering elements (532) also drive a second OR gate 545J which generates a respective, 'complex' or 'cascaded' sum-of-clusters signal, CSoC$_J$. The 'cascaded', CSoC$_J$ signal can define a Boolean sum of more than the 5 local PT's (namely, PT0–PT4) associated with the local cluster, J. CSoC$_J$ can additionally or alternatively represent sums produced from other product clusters. In the illustrated example, the second OR gate 545J has 7 inputs where, after PT0–PT4, the remaining 6th and 7th inputs respectively receive the outputs of corresponding, second OR gates 545{J−K} and 545{J+L}. Typically, K and L will be equal whole numbers but they do not have to be equal. Also, one of the these 6th and 7th extra inputs may be eliminated in alternate embodiments.

The CSoC$_J$ signal produced by second OR gate 545J feeds not only a local, sums-sharing array 546J, but also inputs of one or both of corresponding, second OR gates 545{J+K} and 545{J−L}. The local, sums-sharing array 546J, receives not only the local CSoC$_J$ signal, but also other such cascaded sum signals, for example, the set defined in the range CSoC$_{J-M}$ to CSoC$_{J+M}$ (with wrap around). The value of integer M can be unrelated to K and L, but as will be seen in the embodiment of FIG. 4A, K, L and M are preferably tuned so as to minimize sum overlappings and to thereby minimize potential wastage of processing resources. Although it may have other values, in one embodiment M covers 6 other ones of the second OR gates CSOC$_{J-M}$ to CSoC$_{J+M}$ so that a total of up to 7 cascaded sums from 7 such second OR gates may be supplied to third OR gate 547. Third OR gate 547 then feeds its respective output signal (CCsoC$_J$) 548 to a first input of XOR gate 551. It is understood that various ones of the 7 inputs of third OR gate 547 may be selectively deactivated by feeding them a logic '0' instead of a varying signal from the sums-sharing array 546J.

Possible internal structurings for the sums-sharing array 546J will be described when FIGS. 4A–4B are detailed below. It should be apparent from the broad overview of FIG. 5 that first OR gate 533-J provides a 'fast' path for generating the 'simple'sum-of-products signal, SSoC$_J$ on line 535, if that is all that is desired from circuit section 500. It should be apparent that, in contrast, the second OR gate 545-J, the sums-sharing array 546J and the third OR gate 547, provide a somewhat 'slower' path but that they can generate the comparatively more complex, 'combined' set of cascaded sum-of-products signal, CCSoC$_J$, (548) if the latter, more complex signal better suites the needs of the design that is being implemented by the subsuming HCPLD (100, FIG. 1). The signal generating resources of second OR gate 545-J can service the sums-sharing array 546{J±Q} of another module even while the illustrated module J is configured to use its fast path.

The fast-and-simple result signal 535 and the slower, but more complex result signal 548 may be respectively supplied to first and second inputs of XOR gate 551 as shown. The corresponding output signal 552 of XOR gate 551 couples to one input of one or both of a first data-selecting multiplexer 553 and a second data-selecting multiplexer 554 provided in macrocell section 550.

Each of the illustrated PT-steering elements 532 can be a one-to-two-of-N steerer which can be programmably configured to either steer its respective PTi signal to designated input terminals of first and second OR gates 533-J and 545-J, or to supply a logic '0' (GiX=0) to such terminals of OR gates 533 and 545. If the respective PTi signal is not steered to OR gates 533 and/or 545, the PTi signal may be instead steered to an i-th local control within the Jth macrocell module 500. If the respective PTi signal is not steered to the i-th local control, then the respective PT-steering element 532 should provide a predefined default control signal on the line 534 of that respective i-th local control. The exact nature of each of the, up-to-five local controls can vary in accordance with different design goals. A more specific design will be detailed in the below discussion of FIG. 6. By way of an introductory example for FIG. 5 though, the optionally re-directed PT signals that are steered through the local-control lines 534 of PT-steering elements 532 can be applied to a respective terminal of soon-described XOR gate 551. Others of the optionally re-directed PT signals can be applied for controlling the polarity and/or edge-sensitivity of the CLK input of storage element 560. They can also be applied to a mode control 559 for causing element 560 to function as a desired one of a D-type flip flop (IN=D), a T-type flip flop (IN=T), a latch (IN=L), or a combinatorial pass-through element (IN=C), where in the last mode, C, the IN signal of element 560 is passed directly to Q output 561 without intermediate storage. In an alternate embodiment, the mode of storage element 560 (where mode can be selectable from D and/or T and/or L and/or C) may be fixed or may be selected from the given set of modes or a subset thereof in accordance with settings made within the CPLD configuration memory (e.g., fuses), or the like.

If not chosen judiciously, each additional amount of control flexibility may significantly increase the amount of configuration memory that is needed for providing it on a per-macrocell basis. One configuration memory bit can be used to define two mutually-exclusive control states. Two configuration memory bits can be used to define four mutually-exclusive control states, and so on. If four states are already consumed and a CPLD designer wishes to add yet another, mutually exclusive control state to such a pre-existing group of 4, the per macrocell impact on configuration memory will be an additional memory cell and a larger decoding circuit for decoding the corresponding group of 3 configuration memory cells that replace the previous two. It is desirable to keep die size overhead for supporting configuration memory and decoding circuits as small as possible.

Thus, choice of when and how PT signals are re-steered should be made on a careful basis. More on this when we reach FIG. 6.

Although FIG. 5 shows sums-sharing of just 7 cascaded signals into third OR gate 547, it is within the contemplation of the invention to utilize smaller or larger ranges that comport with the considerations set forth herein. Third OR gate 547 for example could instead have 9 inputs (split up as 3, 3, and 3 per the teachings of FIG. 4D) while sums-sharing array 546 can similarly combine cascaded signals from 9 (e.g., organized as 4--1--4) rather than a set of 7 OR gates such as 545J. Alternatively, third OR gate 547 could instead have 5 inputs (split up as 2 and 3 per the teachings of FIG. 4D) by way of another example while sums-sharing array 546 similarly combine cascaded signals from 5 rather than a set of 7 OR gates such as 545J. Further variations along such lines are also contemplated including changing the number of macrocells per SLB, changing the number of MFB lines per SLB, correspondingly changing the sizes of the SSM and the GSM, changing the number of output points of PT steerers 532, and so forth.

As seen in FIG. 5, the output signal (548) of OR gate 547 may be supplied to a first of XOR gate 551 while the output signal (535) of OR gate 533J may serve as a polarity control signal that drives to the other input of XOR gate 551. The polarity-adjusted result can be routed to the D-or-T-or-L-or-C input of storage/pass-through element 560 by way of second multiplexer 553. Alternatively, routing multiplexer 553 can route a desired IFB signal (I/O feedback) of the SLB or another kind of signal to the D/T/L/C input (IN) of element 560. In one embodiment, respective ones of the 16 IFB signals 317 (see FIG. 3) from both the local SLB (310) and 16 IFB signals 317' (see FIG. 3) from an adjacent SLB (310', not shown) are respectively fed to respective ones of the 32 macrocell modules in local SLB 310 such that each of IFB signals 317 and 317' can be stored in either selected one or both of the macrocell modules of the local and neighboring SLB as may be desired. In an alternate embodiment, the local 16 IFB signals 317 are fed to respective pairs of macrocell modules in array 312. As seen in FIG.

5, the Q output of storage element 560 can be selected by multiplexer 554 to become the MFB (macrocell feedback) signal 561 of the corresponding macrocell module J. Alternatively, the unregistered version of XOR output signal 552 may be selected by multiplexer 554 to become the MFB signal 561. As another of possible alternatives, multiplexer 554 may select an unregistered version of a supplied IFB signal as the signal to be output on MFB line 561.

The clock, reset and set terminals of storage element 560 can receive respective control signals by way of respective multiplexers 555, 556 and 557, each of which is configured by a respective part of configuration memory. The routed clock, reset and set signals can respectively include G__CLK's (up to 4 such globally-distributed clocks), SLB__CLK, SLB__RST and SLB__OE signals. FIG. 3 shows that these SLB__CLK, SLB__RST and SLB__OE signals can be produced by respective AND gates A160, A161 and A162 as independent PT signals. The default is a logic '0' if PT signals are not so-used for respectively generating the SLB__CLK, SLB__RST and SLB__OE signals.

Continuing in FIG. 3, a fixedly selected subset of 16 of the 32 MFB result signals (bus 322) of macrocells area 312 can be hardwired-wise coupled to 16 respective input terminals of 16 tristate drivers 326. In an alternate embodiment, the 32 MFB result signals (bus 322) of macrocells area 312 can be passed through an optional Output Switch Matrix (OSM— shown as a dashed box) 370 for application to programmably-selected ones of the 16 respective input terminals of the 16 tristate drivers 326. Respective output enable (OE) terminals of tristate drivers 326 may be driven by globally-provided ones (GLB OE's), or block-generated ones (SLB OE's) or independent, locally-produced PT signals (LPT OE's), which OE's may be selected from amongst by programmable multiplexers such as the illustrated multiplexer 341. Each of the 16 tristate drivers 326 may have an independently configurable slew rate (control not shown, see FIG. 6B).

The optional OSM 370 may be structured as a H32+/V16 partially-populated switch matrix. (The H32+ part indicates that there optionally may be more than 32 horizontal lines, as will be explained.) Multiplexer size may be in the range of 4:1 through 16:1. Thus each I/O pad 316 can have an MFB signal programmably routed to it from any one of, between 4 to 16 macrocells of the same SLB (or optionally from other macrocells of other SLB's). The optional OSM 370 gives CPLD configuring software flexibility in placing a particular function in one macrocell and then routing it to a desired output pad 316. This feature may be used for realizing re-design PinOut-Consistency (re-design Pin-Retention). A same I/O pad may be used for a given function even though re-design causes the CPLD configuring software to shift the placement of the implementing macrocell within the SLB. The dashed plurality of MFB$_{J\pm1}$ lines 323 represent a further optional addition of more horizontal shortlines that may be added into the H32+ parameter of OSM 370 so that pad 316 may receive MFB outputs from neighboring SLB's if desired. Of course this can disadvantageously increase die size and propagation time through the OSM. Thus a hardwired connection of for example, just even-numbered or odd-numbered ones of the MFB signals (322) to a respective 16 inputs of the 16 tristate drivers 326 may be preferred. Note that the combination of IFB extension 317' and MFB extension 323, if provided from a same, adjacent SLB (or if provided in split fashion from parts of same, adjacent SLB's, within or outside the local segment) can provide a local form of pins-sharing and can thereby relieve the GSM 380 of providing global lines for supporting such a pins-sharing functionality.

Combined signal bus 328 may be formed, as already explained, by combining the 32 MFB signals of bus 322 with the 16 IFB signals of bus 317 to thereby provide 48 feedback signals (MFB+IFB) per SLB in the illustrated embodiment. Each bus 328 of each of four SLB's in a segment (101 in FIG. 1) may be combined to define the 192 lines of bus 329. Bus 329 feeds into SSM 350. V384 section 351 can therefore simultaneously carry all the feedback signals (MFB+IFB) of the four SLB's 110–140 of its segment. Intra-segment communications can therefore be provided at the full 100% level irrespective of what happens at the inter-segment (global) communications level. In other words, each segment can operate as its own, fully contained and independent mini-CPLD.

Each of the 48 lines of bus 328 further feeds into a respective 1:3 demultiplexer on GSM 380. Peanut symbol 383 represents one such 1:3 demultiplexer among a plurality of like but staggered demultiplexers. Line 381 represents an exemplary, GSM-feeding line among the 48 lines of bus 328. In one embodiment, the 1:3 DEMUX 383 couples to respective longlines of the GSM such as line 387 by passing its respective, demultiplexed signal 381 through a configurable multiplexer 384 that can further receive other like demultiplexed signals from the respective other 1:3 demultiplexers (383) of other segments. The output of exemplary multiplexer 384 is applied to a tristate longline driver such as 386. While not explicitly shown in FIG. 3, it is to be understood that each GSM longline (e.g., 387) will generally have a plurality of tristate longline drivers such as 386 coupled to, and distributed along, the GSM longline for driving their respective signals (e.g., 381) onto the GSM longline. Contention may be avoided on each GSM longline by enabling no more than the output of one such tristate longline driver at a time for the given longline. The OE (output enable) control terminals of the tristate longline drivers 386 may be controlled either statically by configuration memory or dynamically by applying steered product terms to such OE control terminals.

The 384 horizontal longlines of GSM 380 (of which 387 is an exemplary one) cross with 192 vertical shortlines of bus 385. The 384 times 192 resulting crosspoints are partially-populated by 8:1 multiplexers such as 388. Signal routability from any given GSM line such as 387 to a desired SSM (e.g., 350) is therefore 192×8 divided by 384, or 4-ways per GSM H-line.

External signals can be fed into the CPLD from the pins of nonburied ones of pads 316. The input path of such externally-supplied signals can be purely intra-segment, such as moving from pad 316, through input buffer 336 and through IFB bus 317 (and/or through optional IFB bus 317') directly to macrocells area 312. For the embodiment of FIG. 5, this direct path 317 into MCA 312 continues into multiplexer 553. The externally-supplied signal can then be temporarily stored in element 560 for synchronization with a chip-internal clock (selected by 555) or it can be passed through asynchronously onto MFB bus 322 if storage element 560 is in one of the latch (L) or combinatorial (C) modes.

The input path of an externally-supplied signal can additionally or alternatively be a global one (inter-segment). The signal can propagate from pad 316, through input buffer 336 and through a GSM-feeding line 381 into the Global Switch Matrix 380. From there, it can be broadcast into any one or more segments, as desired, by way of the 192 per segment, 8:1 multiplexers 388.

A summarizing review of FIG. 3 shows that, a particular CPLD architecture has been developed that features a two-tiered hierarchical switch matrix construct in combination with a clusters processing array 360. The two-tiered hierarchical switch matrix construct has a Global Switch Matrix (e.g., GSM 380) and a plurality of Segment Switch Matrices (e.g., SSM 350). Coupled to each SSM is an even plurality of at least four programmable logic blocks (e.g., SLB 310, see also 110–140 of FIG. 1). Each SSM and its even number of SLB's define a segment (101) that couples to the GSM for both injecting SLB result signals 322 and/or I/O pin input signals 336 into (328, 381) the GSM and for extracting (388) globally-provided signals (385) from the GSM for input (311) into each SLB of a given segment.

Each SLB has at least 64-plus complementable inputs (321) and can generate product term signals (PT's) that are Boolean products of as many as 64-plus independent input terms. With use of the clusters processing array 360, incrementally adjusted, small and/or large sums of such large PT's may be produced in each SLB as may be appropriate for a given design implementation. Some of the product terms generated within each SLB may be dedicated to SLB-local controls such as SLB-generated clock, set and reset controls (A160–A162).

Each SLB may have as many as at least 32 macrocells and at least 16 I/O pads (buried or nonburied) which feedback to both to the local SSM (by way of path 328) and to the global GSM (by way of multiplexers 388). Each SSM may have dedicated for intra-segment communications, at least as many longlines (48×4) as there are macrocells (32×4) and I/O pads (16×4) in the segment, thereby assuring that every macrocell signal (MFB) and I/O signal (IFB) can be simultaneously transmitted through the SSM.

The 64-plus parallel inputs (311) of each SLB ease implementation of 64-bit wide designs that include additional control overhead bits. Each segment may have as many as at least 64 I/O pads (316). Symmetry within the design of each segment (101) can allow for more finely-granulated implementations such as for 32 or 16-bit wide designs. A convenient migration path is therefore provided by one unified architecture for implementing 16-bit wide designs, and/or 32-bit wide designs, and/or 64-bit wide designs.

Figure 6A:
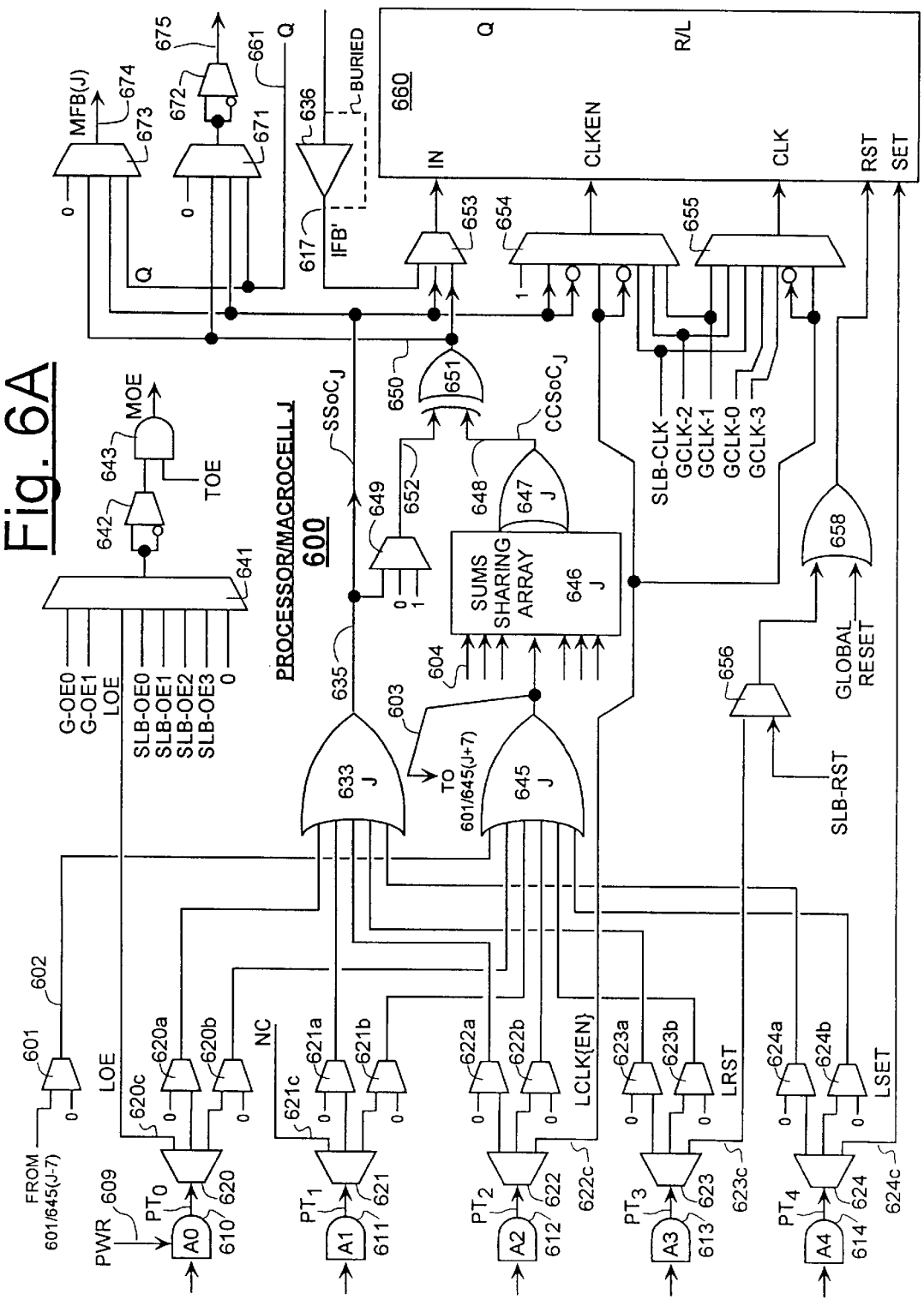
FIGS. 6A–6B form a schematic of another combination of cluster processing and macrocell modules that may be used within the SLB structure of FIG. 3.
Figure 6B:
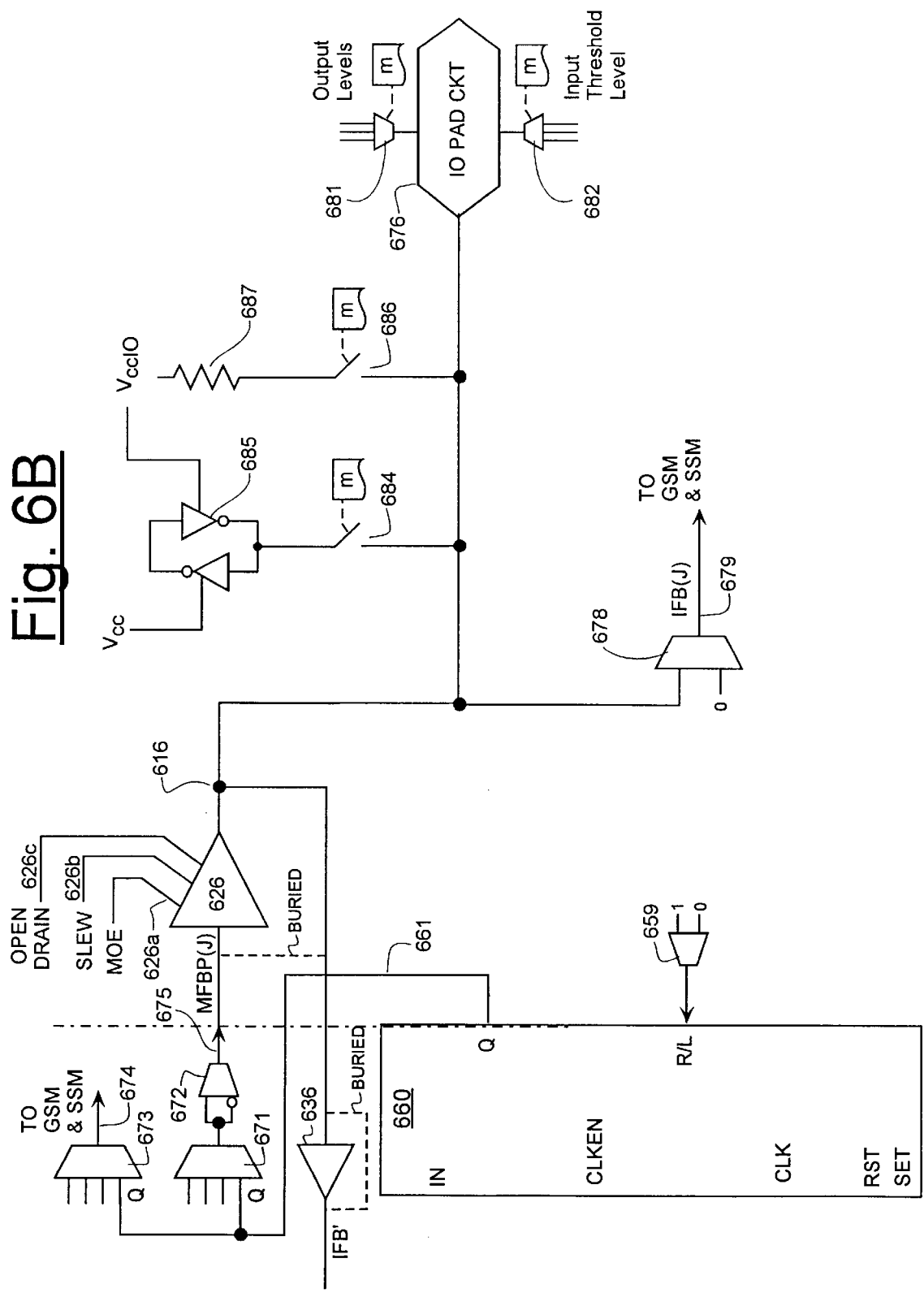

FIGS. 6A–6B illustrate a specific embodiment 600 of a combined cluster processor and storage macrocell module in accordance with the invention. Where practical, reference numerals in the '600' century series are used in FIGS. 6A–6B to refer to elements that have corresponding counterparts in FIG. 5, where the latter are identified by reference numerals in the '500' century series.

As such, each of the illustrated set of five AND gates 610–614 (A0–A4) is understood to obtain a respective subset of independent SLB input signals from its segment's SSM (350) to generate a responsive product term signal, PTi. Respective demultiplexers 620–624 are coupled to the outputs of AND gates 610–614 for programmably directing product terms PT0–PT4 to one or more of OR gates 633, 645 and local control inputs (LOE, LCLK, LRST, LSET). In one embodiment, demultiplexers 620, 622–624 are each implemented as 3 PIP's on the output line of its respective AND gate while demultiplexer 621 is implemented as 2 PIP's on the output line of AND gate 611. Each of the five AND gate circuits, A0–A4 can be forced into a low power mode (via local or macrocell-wide, or SLB-wide PWR control 609) and/or into outputting a constant logic '1' by using techniques described above or equivalents thereof.

A first configuration-controlled multiplexer, 620a couples the PT0 signal (if supplied by configuration-controlled demultiplexer 620) or a logic '0' (e.g., ground) to a respective first input of OR gate 633-J. Similarly, a second configuration-controlled multiplexer, 620b couples the PT0 signal (if supplied by configuration-controlled demultiplexer 620) or a logic '0' to a respective second input of second OR gate 645-J. The first input terminal 602 of OR gate 645-J receives a cross-laced cascading signal or a logic '0' from configuration-controlled multiplexer 601 as will be discussed below. Third output terminal 620c of demultiplexer 620 couples a local (driven by PT0), output enable signal LOE to an OE-selecting multiplexer 641.

In respective and similar fashion, multiplexers 621a and 621b can couple the PT1 signal or a logic '0' to respective first and second OR gates, 633 and 645. In this particular embodiment, there is no local control function (NC) for optional line 621c. In further respective and similar fashion, multiplexers 622a and 622b can couple the PT2 signal or a logic '0' to respective first and second OR gates, 633 and 645. Third output terminal 622c of demultiplexer 622 couples a local (driven by PT2), clock and/or clock enable signal LCLK/EN to complementary polarity inputs of enable-selecting multiplexer 654 and of clock-selecting multiplexer 655. (And of course, where dynamic selection control is not explicitly shown, it may be assumed that static selection by appropriate configuration memory bits and a corresponding decoder, if prudent, are expected to be used.)

In yet further, respective and similar fashion, multiplexers 623a and 623b can couple the PT3 signal or a logic '0' to respective first and second OR gates, 633 and 645. Third output terminal 623c of demultiplexer 623 couples a local (driven by PT3), reset signal, LRST to one input of multiplexer 656. The other input may receive the SLB-shared reset signal, SLB-RST. The output of multiplexer 656 feeds one input of OR gate 658 while the other input may be coupled to receive the globally-shared reset signal of the monolithically integrated circuit, G-RST. The output of OR gate 658 drives the reset input (RST) of register/latch unit 660. The R/L control (driven by multiplexer 659) determines which mode unit 660 will operate in. When in latch mode, unit 660 latches its IN data signal or transparently outputs the same as Q depending on the state of the CLK terminal, provided CLKEN=1. SET and RST can still pre-set and reset the Q state though. In likewise fashion, multiplexers 624a and 624b can couple the PT4 signal or a logic '0' to respective first and second OR gates, 633 and 645. Third output terminal 624c of demultiplexer 624 couples a local (driven by PT4), set signal, LSET to the SET input of register/latch unit 660.

The output of second OR gate 645(J) drives one of 7 inputs of sums-sharing array 646(J). Others of the 3--1--3 organized inputs, such as 604, are driven by corresponding second OR gates 645(J±M)of other modules. The output of second OR gate 645(J) also drives cross-lacing line 603, where the latter can drive one or more respective inputs of a corresponding, one or more second OR gates, (e.g., 645(J±7)of respective other modules J+7 and/or J−7). Input terminal 602 of OR gate 645(J) can receive a cross-laced cascading signal from multiplexer 601, where the latter receives the cascading signal from a corresponding, one or more second OR gates, (e.g., 645(J−7)of respective other module J−7) such that a cascaded series of different ones of the second OR gates can be programmably established in the respective SLB (e.g., 310 of FIG. 3).

While the illustrated example of multiplexer 601 in FIG. 6A implies a unidirectional cross-lacing with a spacing period of cascading together every seventh one of the second OR gates (e.g., 645(0), 645(7), 645(14), etc.), it is within the contemplation of the present disclosure to allow for bidirectional lacing with wrap-around at the edges of the array, in which case OR gate 645 may have 7 inputs rather than 6 and there would be another copy of multiplexer 601 in each macrocell section 600. It is within the contemplation of the present disclosure to allow for a different skip factor periodicity (e.g., 4–9) and/or to provide multiplexer(s) 601 with more than 2 inputs where the other inputs go to differently-spaced ones of the second OR gates 645.

Outputs of the sums-sharing array 646(J) feed into third OR gate 647(J) such that the ORred results of second OR gate 645(J) and the ORred results (e.g., 604) of corresponding other second OR gates 645(J±M) of other modules can be programmably selected in sharing array 646(J) for further ORring together by third OR gate 647(J). Although not explicitly shown, it is to be understood that selectable ones of the inputs of third OR gate 647(J) may be programmably deactivated by feeding them a constant logic '0' in place of a time varying signal from sums-sharing array 646(J).

The combination of cross-lacing lines such as the illustrated 602, 603 and the sums-sharing array 646(J) allows for fine-grained and coarse-grained tuning of: (a) the pin-to-pin signal propagation delays that develop; and (b) the corresponding number of product terms (PT's) that will participate in the formation of the complex, 'combined' set of cascaded sum-of-products signal, $CCSoC_J$, (648) that is output from third OR gate 647(J). $CCSoC_J$ signal 648 feeds one input of XOR gate 651. Multiplexer 649 supplies a selectable one of a logic '0', logic '1' or the $SSoC_J$ signal 635 to second input 652 of XOR gate 651.

Output 650 of XOR gate 651 couples to a first input of register-input multiplexer 653. A second input of register-input multiplexer 653 receives the $SSoC_J$ signal 635. A third input of register-input multiplexer 653 receives an IFB' signal 617 from input buffer 636. (If the macrocell is a 'buried' one, then input buffer 636 may be optionally omitted to save on die space, which omission is indicated by the dashed short-circuiting line around 636 denoted as 'BURIED'. In that case, the IFB' signal may be the same as the MFBP(J) signal shown in FIG. 6B and described below.) As was explained above, register-input multiplexer 653 may be optionally expanded to have 4 or more inputs and to receive another IFB' signal (see 317' of FIG. 3) or the like from one or more other macrocell modules.

In view of the preceding, it is seen that the input terminal (IN) of register/latch unit 660 can receive a selectable one of: (a) the 'simple' and minimally-delayed, sum-of-cluster signal 635, $SSoC_J$; (b) the more-complex and more-delayed, 'combined' set of cascaded sum-of-products signal, 648, $CCSoC_J$; (c) an inverted version of the $CCSoC_J$, 648; (d) a signal representing the exclusive-OR (XOR) of the $SSoC_J$ and $CCSoC_J$ signals; and (e) an IFB' signal, e.g., 617. Before continuing with FIGS. 6A–6B, we take a closer look at FIGS. 4A–4D to better understand what the 'combined' set of cascaded sum-of-products signal, 648, $CCSoC_J$ may represent.

Referring to FIG. 4A, elements CC1-00 through CC1-31 are respective first-level cluster combining circuits which combine the product terms of their respective, 5-term product clusters $PC_0$ through $PC_{31}$. (Use of different numbers of PT's per cluster is of course contemplated.) Each of elements CC1-00 through CC1-31 corresponds to one instance of second OR gate 645 of FIG. 6A. CC1-07 is accordingly also referred to as element 445h. The product-term providing means 420h which provide either the respective product terms of the local cluster, $PC_7$, or logic '0s', to the first-level cluster combining circuits (445h) may be in the form of steering circuits as shown in FIG. 5 or in the form of conventional multiplexers such as those shown in FIGS. 6A and 4C.

Output terminal 403a of element CC1-00 connects by way of a first, forward cross-lacing line, 460 to an input-providing means 401h of element CC1-07. As a result of this, J+7 extending connection 460, the J+7th cluster-combining circuit, 445h can produce a logical OR of not only all, or selected ones, of the PT's in its local product cluster, $PC_7$ but it (CC1-07) may further programmably incorporate into the Boolean sum produced at its output 403h, at least the Boolean sum produced by CC1-00 from PT's of respective product cluster PC0. Because of this, the sum-of-clusters (SoC) signal produced by CC1-07 on its output line 403h can be a sum of selected ones, or all, of product terms in at least either one of product clusters $PC_7$ and $PC_0$. In the case where each PC has 5 product terms, the sum, SoC(7,0, . . . ) so output by CC1-07 covers 10 PT's rather than just 5.

As further seen in FIG. 4A, the d=+7 cross-lacing line 467 continues the chain of cascaded CC1 elements by cross-lacing the result signal on line 403h by a forward skip factor of 7, thereby connecting it to an input of yet another first-level cluster combining circuit CC1-14 (not shown). The latter CC1-14 element is spaced away by a distance of +7 from CC1-07. This cross-lacing sequence then continues under the skip forward +7 algorithm with wrap-around (mod32 wrap) through the full series of illustrated first-level cluster-combining circuits CC1-00 through CC1-31.

As a result of such cross-lacing, element CC1-00 will be able to produce a sum-of-cluster signal, SoC(0, 25, . . . ) in the mod32 series 0, 25, 18, 11, etc. The next element, CC1-01 will similarly be able to produce a sum-of-clusters signal from the mod32 series 1, 26, 19, etc. The already-discussed, eighth element, CC1-07 will similarly be able to produce a sum-of-clusters signal on line 403h in the mod32 sequence 7, 0, 25, 18, etc. where the sequenced numbers identify the product cluster (PC) from which product terms (PT's) are being selectively acquired.

It is to be noted that each adding-on of another product cluster by means of the cross-laced series (e.g., 0, 25, 18, 11, etc.) can add up to five additional product terms to the number of product terms encompassed in the Boolean sum produced by the respective one of elements CC1-00 through CC1-31. Thus, the SoC(0, 25, . . . ) signal produced on output terminal 403a (of CC1-00) can also be represented as a function, f(5, 10, 15, . . . ) of up-to so many respective product terms (PT's).

The signal propagation delay incurred in adding each further cluster of up-to 5 PT's by means of this cascading series is the delay of the first-level cluster-combining OR gate that is spaced J–7 away from the current cluster-combining unit CC1-J, plus the delay through the steering/multiplexing means (401a) which receives that J–7 th result signal. This additional delay in signal propagation tends to be significantly less than the amount of propagation delay that would instead be incurred if cascading of OR gate signals were instead carried out by routing through the Segment Switching Matrix (SSM) and/or through the Global Switch Matrix (GSM). Thus, for the cost of further loading each first-level cluster-combining circuit (CC1-J) with an additional input terminal (which additional input receives the output of a corresponding input selecting means such as 401a), and for the cost of adding cross-lacing lines 460, 461, . . . 469 as shown, and for the cost of adding additional input-selecting means 401a–401h-etc.; one obtains the benefit of being able to finely tune the number of product terms encompassed within a Boolean sum in increments of one product cluster (e.g., 5 PT's) at a time. This incrementing can be achieved without incurring the delay associated with passing cascaded signals through the SSM or GSM and without consuming one of the relatively scarce, and relatively long wires in the SSM and/or GSM for supporting this expanding of the number of summed-together product terms. Moreover, this incrementing can be achieved without consuming one or more of the relatively scarce, 64-plus parallel inputs (311) of each SLB for realizing this incremental increase in result complexity.

Array 446 corresponds to the sums-sharing array 646 of FIG. 6A. Array 446 includes thirty-two vertical lines designated as V0–V31 and thirty-two horizontal buses designated as H00–H31. Each of buses H00–H31 contains seven wires but is shown as a single line for sake of illustrative clarity. Seven (7) PIP's are distributively provided as shown across each of the horizontal buses H00–H31 for coupling respective ones of the output signals of CC1-00 through CC1-31 from the corresponding vertical lines V0–V31 to a corresponding one of the horizontal bus wires so that as many as seven (7=3+1+3) of the first-level result signals (403a, 403h, ... ) may be logically ORred together in the second-level OR gates 447a–447z shown in FIG. 4B. (The second-level OR gates are alternatively designated as CC2-00 through CC2-31.)

It is to be appreciated that each PIP in the illustrated groups of 7 PIP's (hollow circles) in array 446 capacitively loads its respective vertical line, Vi as well as its respective horizontal wire in its corresponding bus Hj of array 446. Adding more PIP's to the illustrated, partially populated crosspoints of array 446 would disadvantageously increase loading on the vertical lines, and increase signal propagation delay. It will also implicitly call for more horizontal wires and more input terminals in the second-level combining circuits CC2-00 through CC2-31 (FIG. 4B).

It should be appreciated that: because of the cross-lacing that can take place in the first-level combining circuits (CC1-00 through CC1-31), and because of the arrayed sharing that can take place in the second-level combining circuits (CC2-00 through CC2-31), the respective result signals 470–479 output from the second level can each be a function of as many as 35 local product terms (35=7×5), or—without additional loading in array 446—as many as 70 local product terms (70=7×10) if one step lacing is used, or 105 PT's (105=7×15) if two step lacing is used, and so forth up to a case where the full 160 PT's produced by AND array A0–A159 (FIG. 3) are summed together by one of the second-level combining circuits (CC2-00 through CC2-31).

The J+7 cross-lacing skip algorithm shown in FIG. 4A is not the only one that could have been used. We could have instead used a J+4 distance, or J+5, or J+6, ... , or J+28. Using a cross-lacing skip factor in the range of J+1 through J+3, or J+29 through J+31 would not provide much of a useful result in the illustrated case because each of the corresponding horizontal buses H01–H03 and H29–H31 can already pick up the CC1-00 output signal (terminal 403a) from the V0 vertical line using its corresponding (real) PIP within array 446. Note that sharing array uses a 3--1--3 PIP distributing algorithm which places one (real) PIP at a central crosspoint, and then 3 (real) PIP's at the immediately next crosspoints to the left, and 3 (real) PIP's at the immediately next crosspoints to the right. (Because of this, a cross-lacing skip factor of 1, 2 or 3 becomes a waste of resources. However, if the 3--1--3 PIP distributing algorithm were replaced with a discontinuous one, say one that skips past some of the vertical wires surrounding the central PIP, and the PIP distributing algorithm still provides for a total of 7 PIP's—or alternatively it provides for 5 or 9 PIP's—then of course, the analysis would be different. We will soon explain how wastage of resources may occur by resorting to a fiction called a 'virtual' PIP (shown in FIG. 4A as a dashed X rather than a hollow circle). It will be seen that if a virtual PIP (dashed-X) overlaps with a real PIP (hollow circle) in the sharing array 446, the virtual PIP does not add any new product terms to the sum-of-products because they are already supplied by the real PIP.

It has been found that for a x--1--x symmetrical distribution of real PIPs within a sums sharing array such as 646J of FIG. 6A (where x=1, 2, 3, etc.) the preferred forward or backward cross-lacing skip algorithm is J±(2x+1); in other words, J±7 in the case where x=3. Using a cross-lacing skip distance of less than ±(2x+1) tends to overlap resources and to not take advantage of the maximum sums-expansion possible. Using a cross-lacing skip distance of greater than ±(2x+1) tends to leave holes in the PT's covered by the cross-lacing. Consider the following case study (whose results are shown in the below CASE STUDY 1 TABLE) done for the x=3 situation, where each cluster has 5 PT's :

CASE STUDY 1 TABLE

| Skip Distance | Maximum Number of Unique PT's Covered for k = 1 | Comments (k = 1 is explained in expression Exp. C.1) |
| --- | --- | --- |
| 1 | 40 | |
| 2 | 45 | |
| 3 | 50 | |
| 4 | 55 | |
| 5 | 60 | |
| 6 | 65 | |
| 7 | 70 | Maximum number of PT's for k = 1, with no gap in coverage |
| 8 | 70 | Maximum number of PT's for k = 1 but leaves a gap of one cluster |
| 9 | 70 | Maximum number of PT's for k = 1 but leaves a coverage gap of two clusters |

It is to be understood that CASE STUDY TABLE shows merely a set of examples and does not imply that it's listed set of skip distances are the only ones possible. It is seen from the CASE STUDY TABLE that the ±(2x+1) cross-lacing skip distance can provide a sum of PT's with a maximum number of unique PT's being coverable and without leaving holes in the coverage span. Of course, if a non-symmetrical x--1--y distribution of PIPs is used within a sums sharing array such as 646J, where y≠x, a corresponding analysis should be performed to see which set of one or more skip distances provides optimal results.

One way of understanding the incremental complexity-increasing capabilities of the combined cross-lacing means (460, 461, etc.) of FIG. 4A and the sharing array 446 of FIG. 4A is by considering the following algebraic expression, Exp. C.1 with the terms ordered as shown:

$$P_{SOS}=(k+1)*B*A \quad \{\text{Exp. C.1}\}$$

In Exp. C.1, the 'B' multiplier represents the base number of summed PT's that can be provided by a first-level ORring of all the PT's of one cluster (e.g., B=5). Further in expression Exp. C.1, the 'A' factor represents the multiplying effect that can be provided by the sharing array (e.g., A=7) if all its real PIP's are used. The 'k' factor is number of levels of cross-lacing employed. $P_{SOS}$ is the effective number of sums of sums of product terms defined by the combination of the first level combining means CC1-00 through CC1-31 and by the second level combining means CC2-00 through CC2-31

. Thus when k=0 (in other words, no cross lacing is used), $P_{SOS}$ can be as large as 5 times 7 in our example (5 PT's maximum per cluster and 7 such clusters being ORred together by array 446 and gates 447a–447z). Thus k=0 translates into an ability to provide a complexity of 35 PT's in a given macrocell feedback signal (e.g., MFB-07 of FIG. 4B).

If k=1 in expression Exp. C.1 (in other words, one step of forward or backward cross lacing is being used), then $P_{SOS}$ becomes 10 times 7 in our example, which translates into a complexity of 70 PT's in a given macrocell feedback signal. If k=2 (in other words, either two successive steps of forward cross lacing are used, or in an alternate embodiment; a combination of both one step of forward and backward cross lacings are used), then $P_{SOS}$ becomes 15 times 7 in our example, which translates into a complexity of 105 PT's in a given macrocell feedback signal. If k=3 (in other words, either three successive steps of forward cross lacing are used, or in an alternate embodiment; a combination of either two steps of forward and one of backward cross lacings are used; or two steps of backward and one of forward cross lacings are used), then $P_{SOS}$ becomes 20 times 7 in our example, which translates into a complexity of 140 PT's in a given macrocell feedback signal (e.g., MFB-07 of FIG. 4B).

It should be observed however that expression, Exp. C.1 does not inherently guarantee that its calculated number of unique PT's will be the sum of unique PT's that is actually realized. There could be overlaps that reduce the effective number of unique PT's in a sum. For example, let us assume hypothetically that two OR gates in combining level one (CC1-nn) pick up a same PT. Logical ORring of that same PT with itself does not produce a more complex sum of products. The overlap merely constitutes a waste of resources. It is therefore desirable to strive for acquisition of uniquely different PT's in the level one (CC1-nn) ORring and in the level two (CC2-nn) ORring operations if complexity of the sums of sums (SOS) of products is to be increased.

Of importance, it should be further observed that, as the cross-lacing factor k increases, the incremental increases of electrical loading associated with expression, Exp. C.1 occur at the front end of the B factor rather than along the long lines (V0–V31) of the sharing array (which array 446 defines the A factor). Mathematically speaking though, it is valid to rewrite the $P_{SOS}$ calculation as a second expression, Exp. C.2 with the terms re-ordered as shown:

$$P_{SOS}=B*A*(k+1) \quad \{Exp.\ C.2\}$$

In the second expression, Exp. C.2 it is implied that somehow the multiplying factor, A of the sharing array 446 can be incrementally increased by the k factor rather than the B factor being so-amplified. We will pretend that instead of increasing B by using front-end cross-lacing, we can alternatively and correspondingly amplify the A factor by adding 'virtual' PIP's into the sharing array 446 to mimic the effect of cross-lacing. As already explained, our fictitious virtual PIP's are represented in FIGS. 4A and 4C–4F by dashed X's. Real PIP's are represented by hollow circles. Of importance, it should be understood that when we show the addition of one virtual PIP (X) to a single row of sharing array 446, we imply that similar additions are being made to the remaining 6 other rows of sharing array 446. Thus, the addition of one virtual PIP to each of the 7 rows of sharing array 446 translates into to increasing the k factor of second expression, Exp. C.2 by one.

Let us now consider more specifically, the case of 3--1--3 PIP's (real) per row as shown in the sharing array 446 of FIG. 4A. It may be noted that horizontal bus H04 is the first in the illustrated top-down sequence of rows H00–H31 that does not have a PIP on vertical line V0. If we had used a J+4 (an evenly-numbered distance) as the cross-lacing skip factor in FIG. 4A instead of the illustrated J+7 skip factor, that hypothetical J+4 skip factor would have had the useful effect of allowing horizontal bus H04 to indirectly pick up the CC1-00 output signal through CC1-04 if single-step cross-lacing (k=1) is used. In essence, we would be adding a 'virtual' PIP (a 'VPIP') at the V0-H04 crosspoint without actually loading array 446 with another real PIP. (And we would also implicitly be adding similarly-situated VPIP's in the other 6 horizontal buses.) The increased complexity that would be possible for the MFB-04 signal would alone be an advantage over what was possible without cross-lacing (k=0). However, the hypothetical J+4 skip factor would not have an optimal effect for increasing signal complexity (the number of unique PT's included in a sum represented by an MFB output signal).

Referring to FIG. 4C, let us consider what happens if the J+4 skip factor is used and we cross-lace over longer cascading strings (k>1) rather than just considering the results of a 1-step cross-lace (k=1); wherein the one step cross-lace we restricted ourselves to just hooking the output of CC1-00 to the input of CC1-04. (In other words, let us consider adding more VPIP's beyond the one VPIP we hypothetically dropped onto H04 at the V0 crosspoint.) If we consider for FIG. 4C (embodiment 400C), the option of cross-lacing 2-steps back (k=2) while using the J+4 skip factor: in other words cascading together CC1-28 followed by CC1-00 followed by CC1-04; we see that in such an alternative arrangement 400C, besides picking up a first virtual PIP ($VPIP_1$ at V0—represented by a dashed X), horizontal bus H04 is picking up the benefit of a second virtual PIP, namely, $VPIP_2$ at the V28 crosspoint (of course, with the cost of the propagation delay through the cascaded series of level-1 OR gates). A similarly-patterned addition of VPIP's is implicitly understood to be occurring on the other horizontal buses H00–H03 and H05–H31. So on H00, for k=1, a VPIP appears on V28; and for k=2, an additional VPIP appears on V24.

When we go 3 steps back (k=3) for horizontal bus H04 we pick up benefit of $VPIP_3$ at V24 (also represented by a dashed X). When we go 4 steps back (k=4) for horizontal bus H04 we pick up benefit of $VPIP_4$ at V20. At this k=4 stage, our second expression: $P=B*A*(k+1)=5*7*5=175$ has tapped out the 160 PT's available from AND gates A0 through A159 of FIG. 3. It does not make practical sense to consider higher vales of k, but we do so anyway because the exercise indicates what will be happening at other horizontal buses that are J+4 away from H04, namely at H0, H8, H12, H16, H20, H24, and H28. The hypothetical $VPIP_5$ (k=5) lands at V16 which happens to overlap with the sharing center of horizontal bus H16. Similarly, hypothetical $VPIP_6$ (k=6) lands at V12 which overlaps with the sharing center of H12. Hypothetical $VPIP_7$ (k=7) lands at V8, the sharing center of HS. Hypothetical $VPIP_8$ (k=8) lands at V4, the sharing center of H4. Hypothetical $VPIP_9$ (k=9, not shown) lands at V0, which is the same vertical line already covered by $VPIP_1$. Continuing from there, we see we are caught in an endlessly repeating loop with no new coverage being provided. In other words, under the J+4 skip factor, the VPIP's of horizontal buses H0, H4, H8, . . . , H28 will be limited to picking up sum-of-products from only V0, V4, V8, . . . , V28. It should be apparent now that because of the even number of vertical lines V0–V31, any even-numbered skip factor (J+4, J+6, J+8, etc.) will have the handicap of not providing full coverage because it will miss odd-numbered vertical lines for even-numbered horizontal buses, and it will miss even-numbered vertical lines for odd-numbered horizontal buses. Also, because of the even number of horizontal buses H0–H31, even-numbered skip factors will exhibit repeated patterns down the rows. So we should strive for an odd-valued skip factor. But which?

Figure 4D:
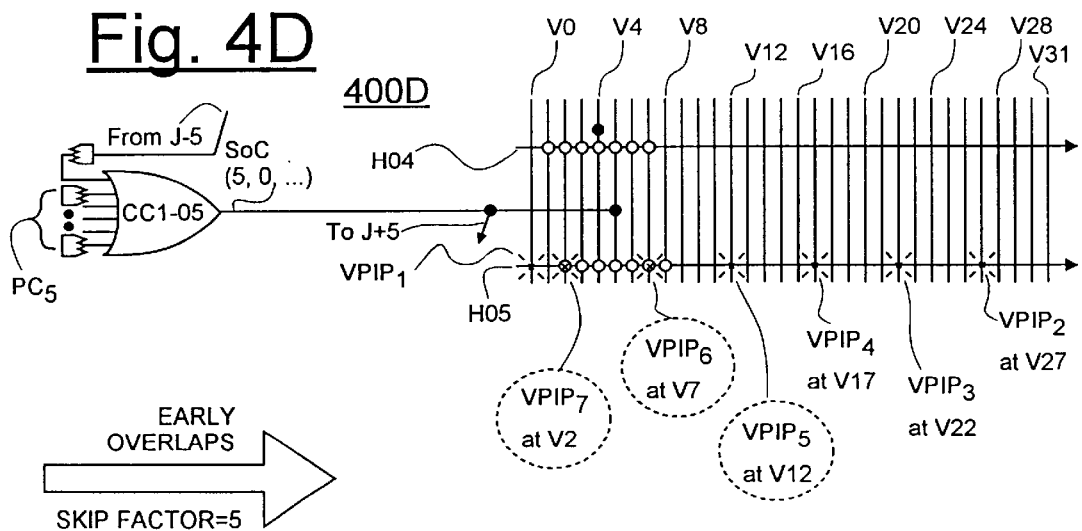
FIG. 4D is a schematic which explains consequences of using a J+5 cross-lacing skip factor.

As seen in FIG. 4D (embodiment 400D), the forward cross-lacing skip factor of J+5 numbered avoids being stuck only on odd or even numbered V-lines and it doesn't quickly loop back on itself. With V5 as our starting point and cross-lacing backwards: $VPIP_1$ (k=1) lands on V-line 0, $VPIP_2$ (k=2) lands on V27, $VPIP_3$ (k=3) on V22, $VPIP_4$ on V17, and $VPIP_5$ on V12. $VPIP_6$ lands on V7. $VPIP_7$ lands on V2, just two crosspoints to the right of $VPIP_1$. It may be appreciated that $VPIP_8$ (not shown) will land on V29, which is 2 crosspoints to the right of $VPIP_2$. $VPIP_{10}$ (not shown) will therefore land 2 crosspoints to the right of $VPIP_3$ and so forth. As a result there will be not be good spread between the VPIP's of a J+5 skip factor.

Figure 4E:
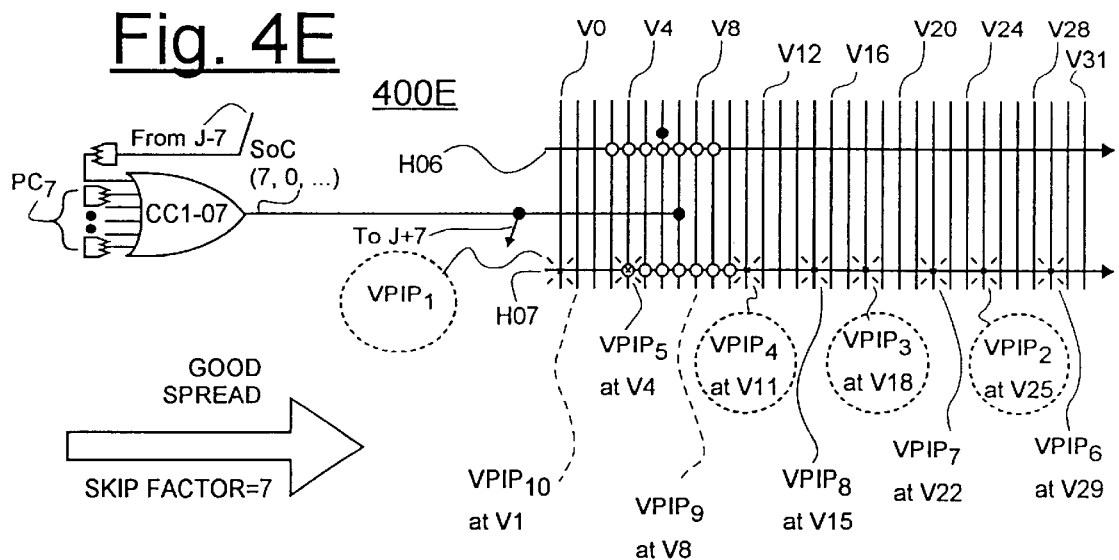
FIG. 4E is a schematic which explains consequences of using the J+7 cross-lacing skip factor that is also illustrated in FIG. 4A.

Referring to FIG. 4E (embodiment 400E), we can see that the cross-lacing skip factor of J+7 provides a better spread and thus a more efficient use of resources. The span of vertical lines that are not covered by real 3--1--3 PIP's zone 408 (see FIG. 4A) is given a fairly good spread of coverage by VPIP1 (k=1) through $VPIP_4$ (k=4).

Figure 4F:
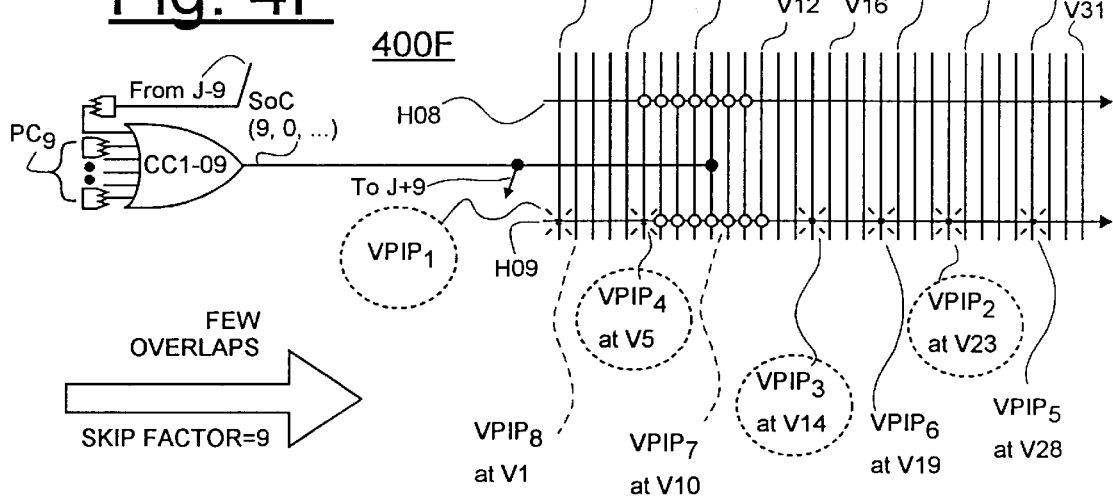
FIG. 4F is a schematic which explains consequences of using a J+9 cross-lacing skip factor.

Referring to FIG. 4F (embodiment 400F), we can see that the forward cross-lacing skip factor of J+9 provides almost similarly good results. However, the wire lengths of the J+9 cross-lacing skip factor tend to be longer than those of the J+7 factor. It is preferable to keep wire lengths relatively short in an integrated circuit (IC) layout. So the J+7 factor is preferred over the J+9 factor when only a single direction cross-lacing is employed.

In spite of the above remarks concerning odd versus even skip factors, it has been found that if a 3--1--4 real PIP's pattern is instead used in sharing array 446, a skip factor of J+8 works nicely. The following CASE STUDY 2 table illustrates how 80 PT's per macrocell feedback signal can be obtained with a single incremental delay associated with k=1. Note in the CASE STUDY 2 TABLE that the eight clusters identified in the columns at the extreme right of the table are those that would be obtained anyway under the 3-1-4 sharing pattern even without the k=1 expansion factor (that is, if k instead equals zero). The eight clusters identified in the next columns to the left are the expanded shares that are obtained with a single-step cross-lacing activation under the J+8 skip factor. Note that the numerical succession of expanded shares (left 8 columns) merges smoothly with the succession of identified base shares (right 8 columns) without either a gap in numerical sequence or an overlap. More specifically, for macrocell #0, the base shares that are obtained without PT expansion are 29–31 and 0–4. The expanded shares that are realized with single-step PT expansion (in other words, k=1 cross-lacing) while using the J+8 skip factor are the clusters identified as 21–28. The 21–28 numerical sequence of cluster identifications merges without gap or overlap into the successive identifications of the base share clusters 29–31 and 0–4, where the latter are associated with base macrocell #0.

CASE STUDY 2 TABLE
Expanded PT Sharing Array: Scheme: 3-1-4

| Macrocell Number | First Expansion | Base PTSA | Expanded PTSA - Up to 80 PT/Macrocell, with One Unit Incremental Delay | | | | | | | | | | | | | | |
|---|---|---|---|---|---|---|---|---|---|---|---|---|---|---|---|---|---|
| | | | Expanded Shares | | | | | | | | Base Shares | | | | | | | |
| 0 | 24 | 0 | 21 | 22 | 23 | 24 | 25 | 26 | 27 | 28 | 29 | 30 | 31 | 0 | 1 | 2 | 3 | 4 |
| 1 | 25 | 1 | 22 | 23 | 24 | 25 | 26 | 27 | 28 | 29 | 30 | 31 | 0 | 1 | 2 | 3 | 4 | 5 |
| 2 | 26 | 2 | 23 | 24 | 25 | 26 | 27 | 28 | 29 | 30 | 31 | 0 | 1 | 2 | 3 | 4 | 5 | 6 |
| 3 | 27 | 3 | 24 | 25 | 26 | 27 | 28 | 29 | 30 | 31 | 0 | 1 | 2 | 3 | 4 | 5 | 6 | 7 |
| 4 | 28 | 4 | 25 | 26 | 27 | 28 | 29 | 30 | 31 | 0 | 1 | 2 | 3 | 4 | 5 | 6 | 7 | 8 |
| 5 | 29 | 5 | 26 | 27 | 28 | 29 | 30 | 31 | 0 | 1 | 2 | 3 | 4 | 5 | 6 | 7 | 8 | 9 |
| 6 | 30 | 6 | 27 | 28 | 29 | 30 | 31 | 0 | 1 | 2 | 3 | 4 | 5 | 6 | 7 | 8 | 9 | 10 |
| 7 | 31 | 7 | 28 | 29 | 30 | 31 | 0 | 1 | 2 | 3 | 4 | 5 | 6 | 7 | 8 | 9 | 10 | 11 |
| 8 | 0 | 8 | 29 | 30 | 31 | 0 | 1 | 2 | 3 | 4 | 5 | 6 | 7 | 8 | 9 | 10 | 11 | 12 |
| 9 | 1 | 9 | 30 | 31 | 0 | 1 | 2 | 3 | 4 | 5 | 6 | 7 | 8 | 9 | 10 | 11 | 12 | 13 |
| 10 | 2 | 10 | 31 | 0 | 1 | 2 | 3 | 4 | 5 | 6 | 7 | 8 | 9 | 10 | 11 | 12 | 13 | 14 |
| 11 | 3 | 11 | 0 | 1 | 2 | 3 | 4 | 5 | 6 | 7 | 8 | 9 | 10 | 11 | 12 | 13 | 14 | 15 |
| 12 | 4 | 12 | 1 | 2 | 3 | 4 | 5 | 6 | 7 | 8 | 9 | 10 | 11 | 12 | 13 | 14 | 15 | 16 |
| 13 | 5 | 13 | 2 | 3 | 4 | 5 | 6 | 7 | 8 | 9 | 10 | 11 | 12 | 13 | 14 | 15 | 16 | 17 |
| 14 | 6 | 14 | 3 | 4 | 5 | 6 | 7 | 8 | 9 | 10 | 11 | 12 | 13 | 14 | 15 | 16 | 17 | 18 |
| 15 | 7 | 15 | 4 | 5 | 6 | 7 | 8 | 9 | 10 | 11 | 12 | 13 | 14 | 15 | 16 | 17 | 18 | 19 |
| 16 | 8 | 16 | 5 | 6 | 7 | 8 | 9 | 10 | 11 | 12 | 13 | 14 | 15 | 16 | 17 | 18 | 19 | 20 |
| 17 | 9 | 17 | 6 | 7 | 8 | 9 | 10 | 11 | 12 | 13 | 14 | 15 | 16 | 17 | 18 | 19 | 20 | 21 |
| 18 | 10 | 18 | 7 | 8 | 9 | 10 | 11 | 12 | 13 | 14 | 15 | 16 | 17 | 18 | 19 | 20 | 21 | 22 |
| 19 | 11 | 19 | 8 | 9 | 10 | 11 | 12 | 13 | 14 | 15 | 16 | 17 | 18 | 19 | 20 | 21 | 22 | 23 |
| 20 | 12 | 20 | 9 | 10 | 11 | 12 | 13 | 14 | 15 | 16 | 17 | 18 | 19 | 20 | 21 | 22 | 23 | 24 |
| 21 | 13 | 21 | 10 | 11 | 12 | 13 | 14 | 15 | 16 | 17 | 18 | 19 | 20 | 21 | 22 | 23 | 24 | 25 |
| 22 | 14 | 22 | 11 | 12 | 13 | 14 | 15 | 16 | 17 | 18 | 19 | 20 | 21 | 22 | 23 | 24 | 25 | 26 |
| 23 | 15 | 23 | 12 | 13 | 14 | 15 | 16 | 17 | 18 | 19 | 20 | 21 | 22 | 23 | 24 | 25 | 26 | 27 |
| 24 | 16 | 24 | 13 | 14 | 15 | 16 | 17 | 18 | 19 | 20 | 21 | 22 | 23 | 24 | 25 | 26 | 27 | 28 |
| 25 | 17 | 25 | 14 | 15 | 16 | 17 | 18 | 19 | 20 | 21 | 22 | 23 | 24 | 25 | 26 | 27 | 28 | 29 |
| 26 | 18 | 26 | 15 | 16 | 17 | 18 | 19 | 20 | 21 | 22 | 23 | 24 | 25 | 26 | 27 | 28 | 29 | 30 |
| 27 | 19 | 27 | 16 | 17 | 18 | 19 | 20 | 21 | 22 | 23 | 24 | 25 | 26 | 27 | 28 | 29 | 30 | 31 |
| 28 | 20 | 28 | 17 | 18 | 19 | 20 | 21 | 22 | 23 | 24 | 25 | 26 | 27 | 28 | 29 | 30 | 31 | 0 |
| 29 | 21 | 29 | 18 | 19 | 20 | 21 | 22 | 23 | 24 | 25 | 26 | 27 | 28 | 29 | 30 | 31 | 0 | 1 |
| 30 | 22 | 30 | 19 | 20 | 21 | 22 | 23 | 24 | 25 | 26 | 27 | 28 | 29 | 30 | 31 | 0 | 1 | 2 |
| 31 | 23 | 31 | 20 | 21 | 22 | 23 | 24 | 25 | 26 | 27 | 28 | 29 | 30 | 31 | 0 | 1 | 2 | 3 |

When k=2 for the 3--2--4 embodiment, one can obtain 120 PT's per macrocell. When k=3 for the 3--1--4 embodiment, one can obtain 160 PT's per macrocell. Experience with different CPLD design applications shows that about 80% of such applications can have their complexity needs satisfied with a PT's per macrocell complexity value of 29–35 PT/MC. In the remaining 20% of applications, a good bulk can have their needs satisfied by a PT's per macrocell complexity value of 35–160 PT/MC. For the relatively rare applications that call for result signals having a complexity of greater than 16OPT per signal, inter-segment cascading may be used to OR additional PT's into the 160 PT/MC signals available from the embodiment of FIGS. 4A–4B.

Figure 4G:
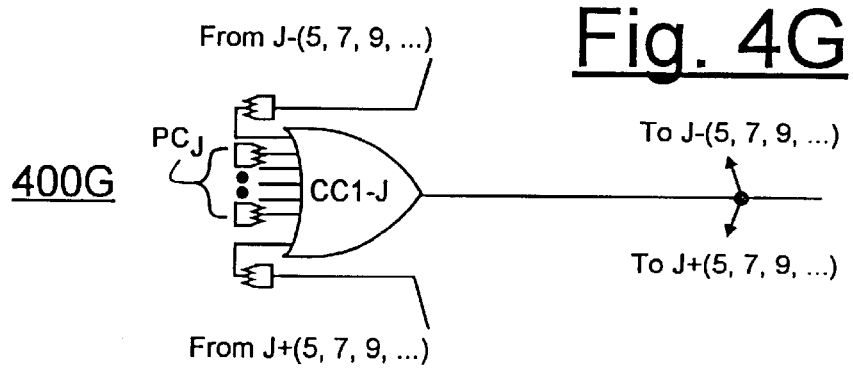
FIG. 4G is a schematic which shows how multiple skip factors and/or bidirectional cross-lacing may be used.

Referring to FIG. 4G (embodiment 400G), it is within the contemplation of the present disclosure to provide first-level cluster-combining units such as CC1-J which utilize one or more of forward cross-lacing factors such as: 'To' J+5, or J+7 or J+9, etc. and corresponding 'From' J–5, or J–7 or J–9, etc. It is within the contemplation of the present disclosure to alternatively or additionally provide first-level cluster-combining units such as CC1-J which utilize one or more of backward cross-lacing factors such as: 'To' J–5, or J–7 or J–9, etc. and corresponding 'From' J+5, or J+7 or J+9, etc. If both are used, the forward and backward cross-lacing skip factors do not have to be the same, although, of course, sameness would make IC layout simpler and would also simplify the tasks of CPLD configuring software. Although they are less advantageous than the odd skip factors, it is nonetheless within the contemplation of the present disclosure to use even skip factors such as J+4, J+6, J+8, etc. It is also within the contemplation of the present disclosure to use real PIP distributions other than the 3--1--3 distribution scheme shown in FIG. 4A. Of course, the analysis tools taught herein may be used manually or with aid of automated computers to determine which cross-lacing skip factor or factors work well in combination with the given, real PIP distribution to provide optimal benefit from the virtual PIP's that are hypothetically created by the cross-lacing process. By optimal benefit, we mean here, one or more of the goals of: (1) locally encompassing a greater numbers of unique PT's within a Boolean sum produced by a given level-2 OR gate (e.g., CC2-00 through CC2-31 of FIG. 4B); (2) achieving a desired level of complexity by the locally-increased number of effective PT's while incurring a minimal incremental delay for doing so (e.g., 0<k<4); (3) providing for compact IC layout and efficient use of the IC's metal layers, and (4) providing for minimal pin-to-pin signal propagation times when input signals and output signals of the overall CPLD are considered in view of a given, implementation task.

Figure 4H:
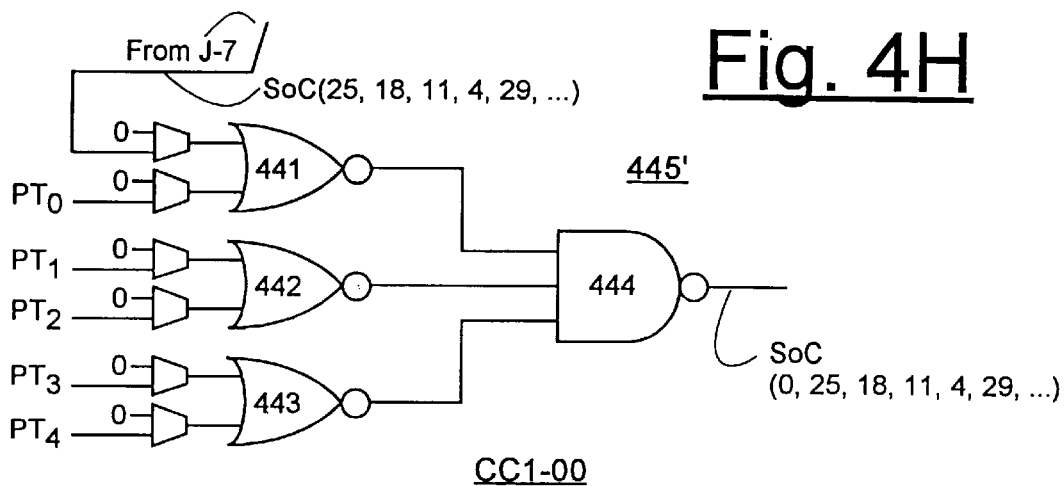
FIG. 4H is a schematic showing details of one embodiment of a cluster-combining (CC) circuit that may be used in the circuitry of FIG. 4A.

With respect to signal propagation times, it is desirable to arrange cluster-combining circuits and the like so as to minimize input loading and thereby reduce delay. FIG. 4H shows a possible organization for a level-1 cluster-combining circuit 445' wherein each gate has 3 or less inputs. As seen in FIG. 4H there is no additional delay for adding the 6th input for the cross-lacing line into NOR gate 441 because NOR gates 442 and 443 delay respective product terms $PT_1$ through $PT_4$ by a same amount with or without the cross-lacing line (From J–7). NAND gate 444 of course combines with NOR gates 441–443 to provide the 6-inputs OR function.

Figure 4I:
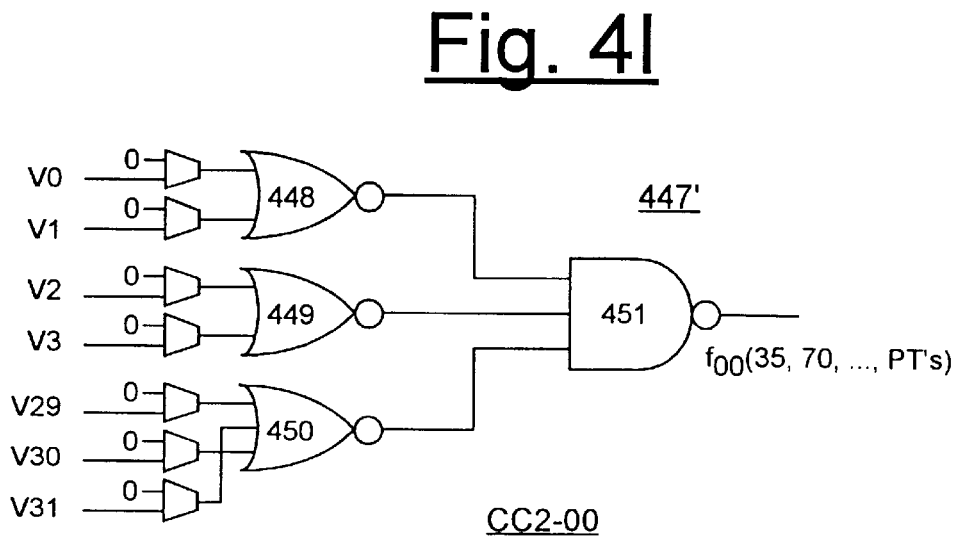
FIG. 4I is a schematic showing details of another cluster-combining (CC) circuit that may be used in the circuitry of FIG. 4B.

FIG. 4I shows that a similar arrangement may be used for the level-2 cluster-combining circuits 447'. NAND gate 451 combines with NOR gates 448–450 to provide the 7-inputs OR function. Equivalent variations may be used.

Figure 7A:
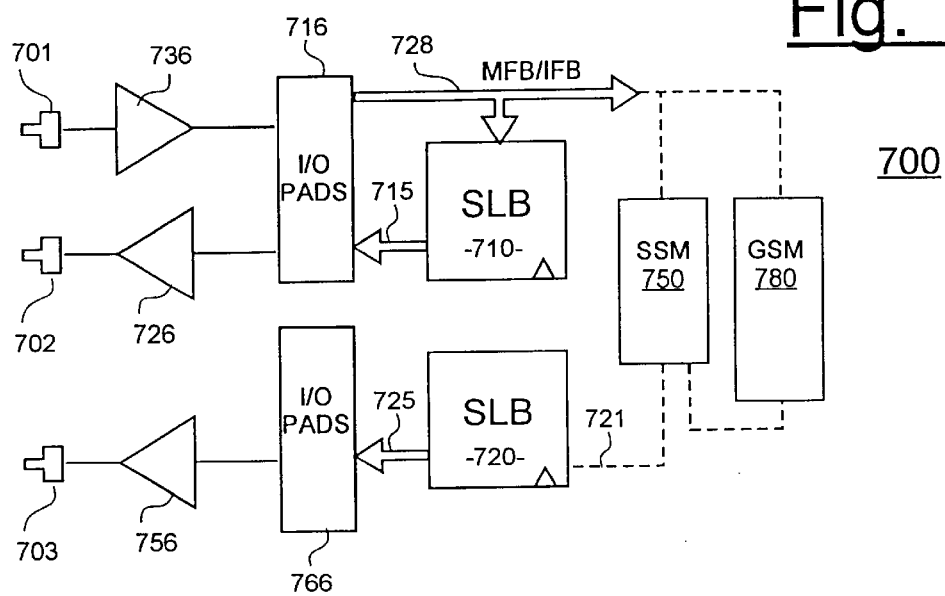
FIG. 7A is a block diagram showing a plurality of pin-to-pin signal propagation paths that may be used in the structure of FIG. 1.
Figure 7B:
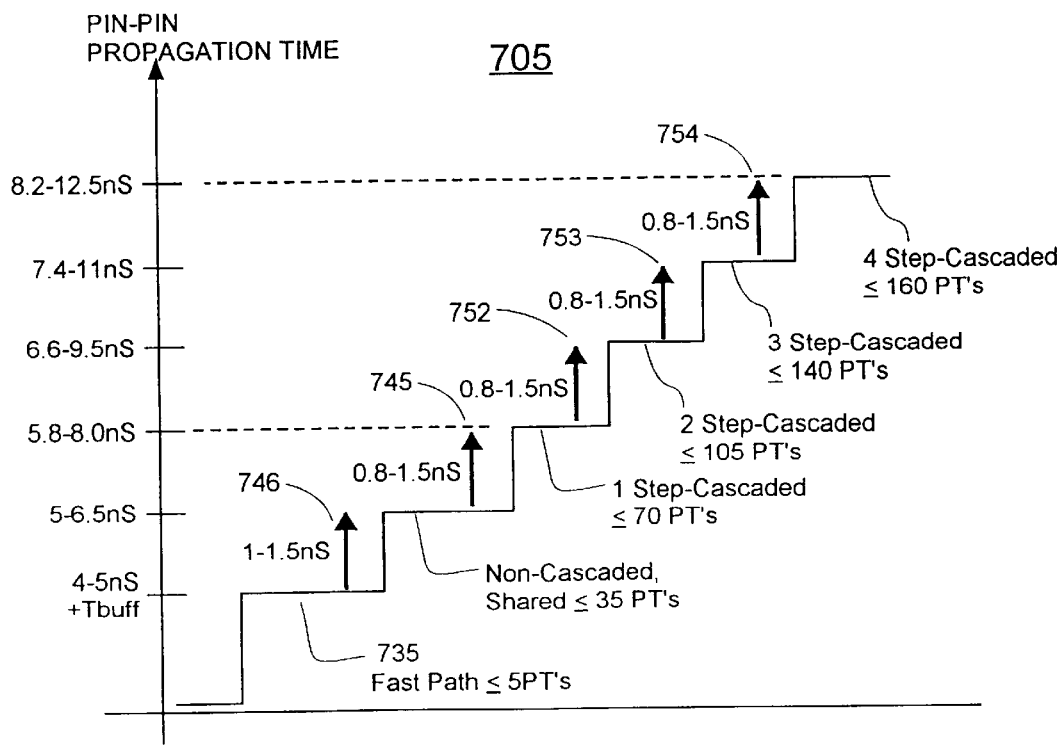
FIG. 7B is a graph showing PT density gains and incremental propagation delay penalties suffered for using the sums sharing array and unidirectional cross-lacing options.

Referring to FIGS. 7A–7B, an example of the tradeoffs between cascading through the SSM and/or GSM versus cascading internally within an SLB is given. In the example 700 it is assumed that any set of pins such as 701 may supply input term signals and that any other set of pins such as 702 or 703 may output result signals that are functions of the input term signals. The complexity of the output result signals may vary depending on application. In some instances such result signals may be as simple as Boolean sums of 5 or less product terms (<5 PT's ). In other instances the result signals may be so complex that they call for more than 35 PT's or more than 70 PT's , and so forth, in order to be appropriately expressed.

As seen in FIG. 7A, the input term signals (701) may be delayed by input buffering circuits such as 736 (e.g., level shifting and static discharge protection) prior to reaching a chip-internal SLB such as 710. If cascading through other SLB's such as 720 is to be carried out, the pin-to-pin propagation delay will include delay due to passage of the cascaded signals through at least SSM 750 if not also through GSM 780. On the other hand, if the result signals can developed to the desired degree of complexity within a single SLB (e.g., 710), then the delay penalty of moving through the SSM 750 and/or GSM 780 may be avoided. Wires not consumed within SSM 750 and/or GSM 780 can be made available for other uses, thereby reducing routing congestion problems within the SSM and/or GSM. Delay through output buffering circuits such as 726 or 756 will be generally incurred irrespective of whether inter-SLB or intra-SLB signal development is carried out. By way of a more specific example, assume that the delay penalty of moving through the SSM 750 is about 3 to 4 nS while the delay penalty of a one-step intra-SLB cascade is commensurately, about 0.8 nS to 1.5 nS. In such a case, for a same number of in-sum PT's , the intra-SLB cascading approach would provide a signal propagation delay that is about 2 to 3 nS shorter. Often, it is advantageous to have a shorter signal propagation time.

Also, if the intra-SLB output path 715 is to be used and the output complexity is less than 6 PT's , then fast path OR gates such as 633 in FIG. 6A may be used. In one embodiment, the input pin to output pin propagation time can be as little as about 4 to 5 nanoseconds (4–5 nS) not counting the additional delays (Tbuf) for input and/or output buffering if fast path OR gates (e.g., 633) are used. This is represented by plateau 735 in graph 705 of FIG. 7B. If output complexity in the range, 5 PT's<Complex≦35 PT's is acceptable, then a sums sharing array such as 646 may be used without relying on cross-lacing. In FIG. 7B, the delay attributed to use of the sums sharing array (e.g., 646) is represented by the incremental delay increase (746) of about 1–1.5 nS, this bringing total delay (not counting Tbuf) to about 5 to 6.5 nS. It can be seen from this that a 7× increase in complexity can be obtained for about a 25% (=1 nS/4 nS) increase in sans-Tbuf delay.

If output complexity in the range, 35 PT's<Complex≦70 PT's is desired, then the sums sharing array (646) and one step of cross-laced cascading (e.g., 602) may be used to achieve such an increase in result complexity. In FIG. 7B, the delay attributed to use of the sums sharing array (e.g., 646) and one-step, unidirectional cascading is represented by the incremental delay increase (745) of about 0.8 nS to 1.5 nS, this bringing total delay (not counting Tbuf) to about 5.8 to 8 nS. It can be seen from this that a 14× increase in complexity (from 5 PT's to 70 PT's ) can be obtained for about a 45% (=1.8 nS/4 nS) increase in sans-Tbuf delay.

Similarly, if output complexity in the range, 70 PT's<Complex≦105 PT's is desired, then the sums sharing array (646) and two steps of cross-laced cascading (e.g., 602, 603) may be used to achieve such an increase in result complexity. In FIG. 7B, the delay attributed to use of the sums sharing array (e.g., 646) and two-step, unidirectional cascading is represented by the incremental delay increase (752) of about 0.8–1.5 nS, this bringing total delay (not counting Tbuf) to about 6.6 to 9.5 nS. It can be seen from this that a 21× increase in complexity (from 5 PT's to 105 PT's ) can be obtained for about a 65% (=2.6 nS/4 nS) increase in sans-Tbuf delay. Of course, if bidirectional cross-laced cascading (e.g., FIG. 4G) had been used instead, the adding of two other clusters to the central cluster would have happened in parallel, thereby reducing the delay penalty to approximately 45% (=1.8 nS/4 nS), this coming however with the cost of additional die space being consumed by the bidirectional cross-lacing approach.

As seen by further incremental steps 753 and 754, the full 160 PT's potential of SLB 310 (FIG. 3) may be reached in the unidirectional, one branch, embodiment (FIGS. 4A–4B) in a total of just 4 steps. Fewer steps may be required if bidirectional and/or multibranched types of cross-lacing are used or if the number of real PIP's per row in the sharing array is increased (e.g., to 3--1--4). More incremental cross-lacing steps may be needed to exhaust the SLB's PT's in yet other embodiments (e.g., 2--1--2). The multibranched types of cross-lacing may include unidirectional cross-lacing which simultaneously employs different skip factors such as J+5 and J+7.) This of course assumes that the CPLD configuring software is able to acquire all the desired product terms in one SLB (e.g., 710) and to distribute all desired, first-level sums (e.g., 403a, 403h) on appropriate ones of vertical lines V0–V31 of array 446 so that real or virtual PIP's of the array 446 can collect those first-level sums for production of the second-level sums (470–479). In cases where the CPLD configuring software is not able to so distribute the first-level sums, it may be necessary to perform cross-lacing through more than the minimum number of steps needed for a given level of complexity. It may be left up to the discretion of the CPLD configuring software to automatically determine whether multi-step cross-lacing in a single SLB provides a better solution than inter-SLB cascading given a design's constraints on signal timing and/or other factors. The point is that now the CPLD configuring software has a wider choice of options to choose from in determining how to implement a given design with CPLD technology.

Returning to FIGS. 6A–6B, the Q output 661 of register/latch unit 660 couples to respective first input terminals of output-selecting multiplexers 671 and 673. Respective second input terminals of output-selecting multiplexers 671, 673 receive the unregistered, fast-path signal 635 (SSoC$_J$). Respective third input terminals of output-selecting multiplexers 671, 673 couple to the output 650 of XOR gate 651. Respective fourth input terminals of output-selecting multiplexers 671, 673 receive the logic '0' signal. Selections made by output-selecting multiplexers 671 and 673 may be configured independently. Output 674 of output-selecting multiplexer 673 couples the corresponding MFB(J) signal to wires in the GSM and/or SSM.

The output of output-selecting multiplexers 671 couples to polarity-selecting multiplexer 672. The output 675 of multiplexer 672 is polarity-flippable signal, MFBP(J) similar to the MFB(J) output signal of multiplexer 673 except that its polarity may be programmably flipped by unit 672. The MFBP(J) signal 675 couples to an input of IO pad driver 626. Output 616 (the pad version of the MFBP{J} signal) of driver 626 couples to IO pad circuitry 676. (If the macrocell is a 'buried' one, then pad driver 626 may be optionally omitted to save on die space, which omission is indicated by the dashed short-circuiting line around 626 denoted as 'BURIED'.) IO pad circuitry 676 couples to a second GSM and/or SSM driving multiplexer 678, and to input buffer 636. Output terminal 679 of multiplexer 678 provides a version, IFB(J) of the input feedback signal and couples this IFB(J) signal to the SSM and/or GSM for distribution to other parts of the CPLD device. Multiplexer 678 can alternatively be configured to output a logic '0'.

IO pad driver 626 has a plurality of control input terminals including a main output enable (MOE) terminal 626a, a slew control terminal 626b and an open-drain mode, selecting terminal 626c. As implied by its name, terminal 626c can switch driver 626 between an open-drain output configuration and a CMOS push-pull configuration. If the open-drain output configuration is selected, one or both of pull-up resistance 687 and weak-latch circuit 685 may be activated to prevent line 616 from floating to an unstable meta level and/or generating unwanted noise. Configurable switches 684 and 686 are schematically shown as activating circuits 685 and 687. Those skilled in the art will appreciate that these activating functions may be integrated into circuits 685 and 687.

The main output enable (MOE) terminal 626a is driven by AND gate 643. One input to AND gate 643 is a safety output enable signal, TOE, which may be brought low during chip initialization to thereby prevent contention between tristateable outputs of pad drivers such as 626. A second input to AND gate 643 is a polarity-reversible output of OE-selecting multiplexer 641. Multiplexer 642 can provide the polarity-reversing function. OE-selecting multiplexer 641 can select from among a set of local, SLB-wide and global OE signals. The LOE signal (mentioned above) comes from demultiplexer 620 of the local macrocell section 600. The SLB-wide four signals, SLB-OE0 through SLB-OE3 may be generated by the respective four SLB's and output from their respective SLB-shared AND gate A162 of FIG. 3 as the respective SLB-OE signal. The chip-wide or 'global' G-OE0 and G-OE1 signals may be generated off-chip and input into the CPLD or may produced by one of the SLB's on the chip and distributed globally to other SLB's of the CPLD. OE-selecting multiplexer 641 may also be configured to produce a constant logic '0' which is optionally reversible by polarity-reverser 642 into a constant logic '1'.

Although not detailed, the slew-control 626b of pad driver 626 may be controlled by configuration memory to select among two or more slew rates. IO pad circuitry 676 may have additional controls, 681 and 682 for programmably selecting I/O parameters such as output levels (e.g., 1.8V, 3.3V or 5V) and input threshold values.

As shown in FIG. 6A, in addition to being able to select amongst the local clock/enable signal LCLK{EN} 622c and its inverse, the clock-enable selecting multiplexer 654 may pick amongst a logic '1' and the SSoC$_J$ signal (635) and its inverse. The clock-enable selecting multiplexer 654 may be further configured to instead pick one of global clock signals GCLK1, GCLK2 or SLB-wide clock signal, SLB-CLK (latter obtained from one of SLB-shared AND gates A160–A162).

Similarly in addition to being able to select amongst the local clock/enable signal LCLK{EN} 622c and its inverse, the clock selecting multiplexer 655 may pick amongst five other clocking signals, namely, the global clock signals GCLK0–GCLK3 and the local SLB-wide clock signal, SLB-CLK.

A flexible macrocell section 600 is therefore provided for synchronously or asynchronously storing in register/latch unit 660, result signals representing either simple (635) or fairly complex (650) functions of the product terms acquirable by the SLB. It may be seen from a summarizing review of the above that flexible and efficient structures for macrocell modules and respective cluster-processing circuits have been disclosed. These structures can efficiently adapt to the control overhead needs, pinout needs, and speed requirements of designs whose parallel address and/or data paths are 16-bitbits wide, 32-bits wide, or 64-bits wide. Designs can be provided in which CPLD logic exhibits re-design Speed-Consistency, and/or re-design PinOut-Consistency, and/or the ability to implement in one pass, with or without intra-SLB cascading, the generation of complex function signals. Some or all of the five or more product term signals (PTi's) of each macrocell section 600 used for providing local control functions in place of SLB-wide or global-wide controls, as needed. Sum-of-products results (SoP's) of respective clusters can be shared and/or cascaded to thereby produce result signals of incrementally greater or lesser function depth, as may be appropriate for a given CPLD-implementing problem.

The present disclosure is to be taken as illustrative rather than as limiting the scope, nature, or spirit of the subject matter claimed below. Numerous modifications and variations will become apparent to those skilled in the art after studying the above disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering the extrapolations.

By way of a first example of a further modification in accordance with the disclosure it may be noted that although FIG. 1 shows only 4 SLB's per segment, it is within the spirit of the invention to provide CPLD devices that have a fewer number or a larger number of SLB's per segment with appropriate adjustments being made to the number of wires provided in the SSM and/or GSM.

By way of a second example, FIG. 3 can be modified to include, in place of the respective 16 OE multiplexers, a plurality of sixteen, 1-to-2-of-N steering switches (see 231) that are programmable to steer the respective global OE's, SLB-generated OE's and local OE's either to the OE terminal of the respective tristate driver 326 or to at least one, otherwise programmably-specified control terminal, for example, selected ones of the OE controls of tristate longline drivers 386 in the GSM. If the OE output signals of such modified multiplexer 341 are steered away from the respective OE terminal of driver 326, then the 1-to-2-of-N steering switch is further programmable to apply one or the other of an output enabling level (OE=1) or output disabling level (OE=0) to its respective tristate driver 326. Of course, by inserting such steering switches, the propagation time for OE-controlling signals are increased and the size of the CPLD configuration memory is increased. Thus the design shown in FIG. 3 is faster and simpler.

By way of a third example, the optional OSM 370 in FIG. 3 can be further modified as indicated by dashed bus 323 to have more than 32 H-lines, where the additional H-lines (up to 32 more) receive respective MFB signals from one or more other SLB's. This allows SLB 310 to 'lend' or 'donate' its pads (316) for the outputting of result signals from the other SLB's if SLB 310 is not itself using such pads (316, buried or not) for the outputting of result signals Of course, by inserting such additional pad sharing functionality, signal delays through the modified OSM and along lengthened MFB buses (322) may increase disadvantageously. Also, the size of the CPLD configuration memory will be increased to support the additional flexibility and the size of the IC die will increase commensurately. Thus the design shown in FIG. 3 is faster, smaller, simpler and cheaper to manufacture.

Figure 8A:
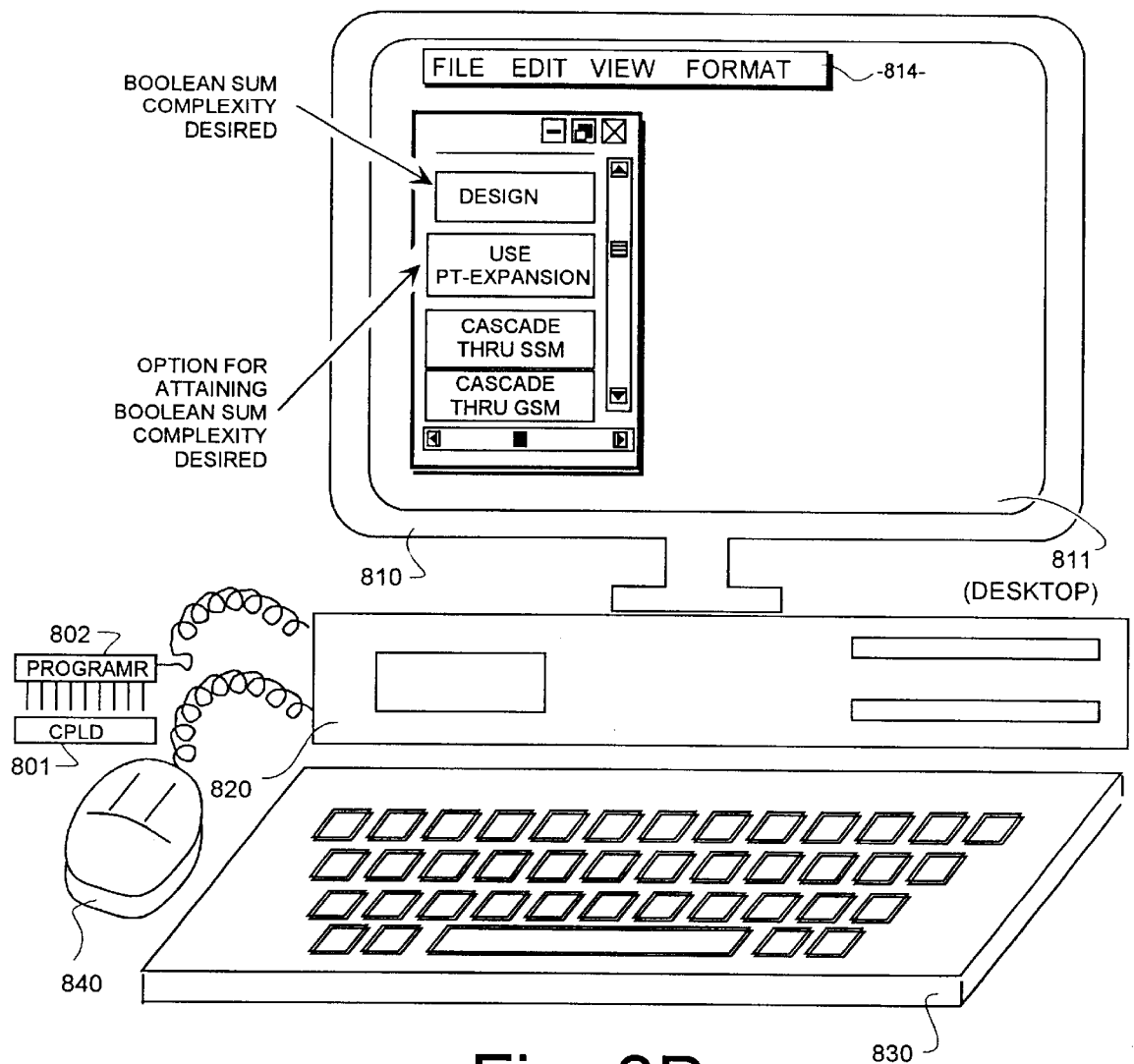
FIG. 8A is a perspective view of a computer structured in accordance with the disclosure to provide the selectable option of using PT-expansion (cross-lacing) to obtain a desired level of result signal complexity where additional or alternate options are to cascade primitive signals through the SSM and/or GSM of the CPLD being programmed.
Figure 8B:
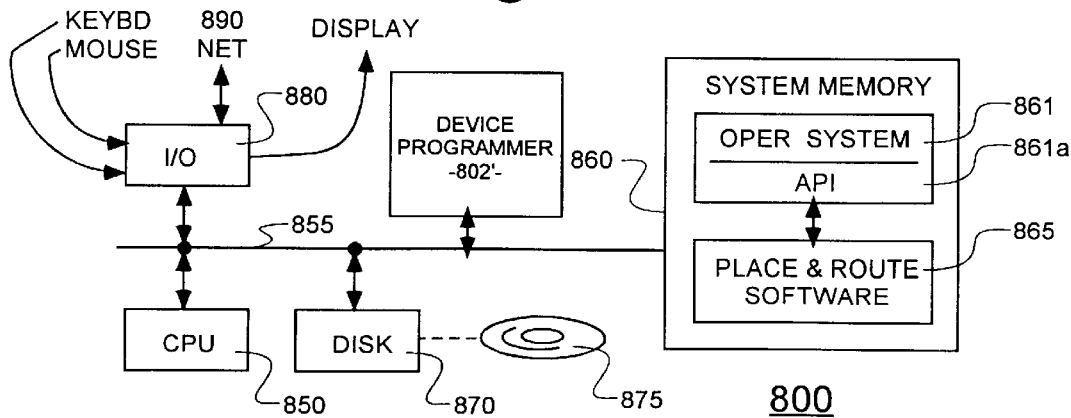
FIG. 8B is a block diagram showing an organization that may be used for the computer of FIG. 8A and showing how manufactured instructing signals may be introduced into an instructable portion of the computer for causing the computer to produce CPLD configuring signals that make use of the PT-expansion capability of a to-be-programmed CPLD.

By way of a further example, it is understood that the configuring of a CPLD (e.g., 801 of FIG. 8A) in accordance with the disclosure can include use of a computer (e.g., 800 of FIGS. 8A–8B) to carry out activation of PT expansion as part of the place and/or route activities. A computer-readable medium (e.g., 875) or another form of a software product or machine-instructing means (including but not limited to, a hard disk (870), a compact disk, a flash memory stick, a downloading of manufactured instructing signals over a network (e.g., 890) and/or like software products) may be used for instructing an instructable machine (e.g., 850) to carry out such place and/or route activities (e.g., 865), where the activities can include selective activation of PT-expansion (use of cross-lacing) in accordance with the disclosure the configuration data defines configuration signals which can be loaded via a programming device (802). As such, it is within the scope of the disclosure to have an instructable machine carry out, and/to provide a software product adapted for causing an instructable machine to carry out a machine-implemented method comprising: (a) first determining if said, called-for-number of PT's is less than or equal to the number of inputs of the first OR gate (e.g., 633), and if so, selectively using the first sum-of-products signal (635) of a selected macrocell section to represent the Boolean sum of said called-for-number of PT's; (b) second (746) determining if said, called-for-number of PT's is greater than the number of inputs of the first OR gate (633) but within the range of PT's producible by the combination of the sums sharing array (446,646) and a third OR gate (647) without use of cascaded cross-lacing of second sum-of-products signals (603), and if so, selectively using the third sum-of-products signal (635) of a selected macrocell section to represent the Boolean sum of said called-for-number of PT's without relying on use of cascaded cross-lacing of second sum-of-products signals; and (c) if said first and second determinings do not satisfy the called-for-number of PT's, selectively using (745,752) the third sum-of-products signal (635) of a selected macrocell section to represent the Boolean sum of said called-for-number of PT's while also relying on use of a minimized number of cascaded cross-lacings of second sum-of-products signals to satisfy the called-for-number of PT's.

Given the above disclosure of general concepts and specific embodiments, the scope of protection sought is to be defined by claims appended hereto.

What is claimed is:

1. In a monolithic, Complex Programmable Logic Device (CPLD) [300] having plural logic blocks [110–140] where each logic block has a respective plurality of product term generators [A0–A162] that generate corresponding and independent product term (PT) signals [PT0–PT162], where each logic block has a respective plurality of first, base cluster combiners [645,cc1] each coupled for combining a respective base subset of PT signals from amongst the respective plurality of PT signals of the logic block, where each logic block has a respective sharing array [446] and a respective plurality of second combiners [CC2] for selectively combining outputs [403a] of the first, base cluster combiners, the improvement comprising:

selectively activatable [401a] cross-lacing couplings [460,461, . . . 469] of outputs [403a] of respective first ones of the first, base cluster combiners to respective inputs of different and respective second ones [445h] of the first, base cluster combiners; wherein when activated [401h] the cross-lacing couplings can increase the number combined PT signals respectively represented by the outputs [403h] of the second ones of the first, base cluster combiners.

2. The improvement of claim 1 and further wherein:
plural clusters of the PT signals [PT0–PT159] provided to the first, base cluster combiners of given logic block can be effectively combined into one output signal [648] of a given second combiner [647] in the logic block by activating successions [745–754] of said cross-lacing couplings where each succession has no more than four [754] such activated cross-lacing couplings.

3. The improvement of claim 1 and further wherein:
at least a subset of the selectively activatable cross-lacing couplings are characterized by a skip factor [J+7] that is a predefined function of a number of outputs [403a] of the first, base cluster combiners that are combinable by one of the second combiners [cc2].

4. The improvement of claim 3 wherein said number of outputs combinable by one of the second combiners is at least seven (7) and wherein said skip factor is at least seven (7).

5. A configuring method for implementing with a Complex Programmable Logic Device (CPLD), designs that have predefined function depth constraints, speed constraints and/or Pin-Retention constraints, said method comprising at least the below step (a) and additionally one or more others of the following steps (a)–(g):
  (a) using unidirectional or bidirectional cascaded cross-lacing [FIG. 4G];
  (b) using a sums-sharing array [446] for summing together first-level sums [603] of plural macrocell sections of the CPLD;
  (c) using an XOR gate [651] within a macrocell section of the CPLD to combine a local sum-of-products signal [635] with other sum-of-products signals [604,648] produced in other macrocell sections of the CPLD;
  (d) in combination with one of steps (a), (b) or (c), selecting clock-enables [654] and register clock signals [655] on a macrocell-by-macrocell basis;
  (e) in combination with one of steps (a), (b) or (c), providing [641] OE control for pad-driving tristate drivers [626] on a pad-by-pad basis;
  (f) in combination with one of steps (a) through (e), directing [620c] one or more product term signals of a given macrocell section for providing a macrocell-local control function in place of, or in addition to, using the directed PT signals for generating respective sum-of-products signals; and
  (g) in combination with one of steps (a) through (f), programmably routing MFB signals through an OSM [370] so as to achieve PinOut-Consistency.

6. A cluster processor [360,400] for use in a Complex Programmable Logic Device (CPLD), where the processor receives pluralities of product term signals (PT's) organized as clusters and the processor comprises:
  (a) a plurality of first combining units [CC1-00-31] each receiving as respective first input signals, a respective cluster of PT's [PC-0-31] and a respective one or more cross-lace signals [401h],
    (a.1) where each of the first combining units can selectively combine its respective first input signals in accordance with a first Boolean function to thereby produce a respective, first-combined signal [403h], and
    (a.2) where at least a subset of two or more of the first-combined signals of corresponding ones of the first combining units defines [460,461] the respective cross-lace signals that serve as first input signals for others of the first combining units;
  (b) a plurality of second combining units [CC2-00-31] each receiving a respective set of second input signals,
    (b.1) where each of the second combining units can combine its respective second input signals in accordance with a second Boolean function to thereby produce a respective, second-combined signal [470]; and
  (c) a sharing array [446], interposed between the first and second combining units, and selectively coupling subsets of the first-combined signals to serve as the second input signals of the respective ones of the second combining units.

7. The cluster processor [360,400] of claim 6 where each of said first and second Boolean functions includes an OR function.

8. The cluster processor [360,400] of claim 6 where said selective coupling subsets of the sharing array have a predefined span, where said cross-lace signals of the first combining units have skip distances defining how far forward or backward they skip over corresponding ones of the first combining units to cause the first-combined signal of one first combining unit to become the cross lace signal of another first combining unit, and at least one of the skip distances is interrelated to the predefined span of the sharing array.

9. The cluster processor [360,400] of claim 8 where said at least one of the skip distances is equal to the predefined span of the sharing array.

10. The cluster processor [360,400] of claim 9 where each of said at least one of the skip distances and the predefined span of the sharing array is equal to seven.

11. A Complex Programmable Logic Device (CPLD) [300] comprising:
plural logic blocks [110–140] where each logic block has a respective plurality of product term generators [A0–A162] that generate corresponding and independent product term (PT) signals [PT0–PT162], where each logic block has a respective plurality of first, base cluster combiners [645,CC1] each coupled for combining a respective base subset of PT signals from amongst the respective plurality of PT signals of the logic block, where each logic block has a respective sharing array [446] and a respective plurality of second combiners [cc2] for selectively combining outputs [403a] of the first, base cluster combiners; and
expansion means for selectively activating [401a] a cross-lacing [460,461, . . . 469] of outputs [403a] of respective first ones of the first, base cluster combiners to respective inputs of different and respective second ones [445h] of the first, base cluster combiners; wherein when activated [401h] the cross-lacing couplings can increase the number combined PT signals respectively represented by the outputs [403h] of the second ones of the first, base cluster combiners.

12. A programmable logic device comprising:
  (a) a plurality of product term generators;

(b) a plurality of first product term summers each having an output and plural inputs;

(c) a plurality of programmably-activatable switch means each for selectively coupling a respective cross-laced signal to a respective input of a corresponding one of said first product term summers; and (d) a plurality of cross-lacing lines each extending from an output of a corresponding first product term summer to the programmably-activatable switch means of a logically spaced apart, other first product term summer such that complexity of a sum of products signal output by the other first product term summer is enriched by selective incorporation of the cross-laced signal into the inputs of the other first product term summer.

13. The programmable logic device of claim 12 and further comprising:

(e) a plurality of second product term summers each having an output and plural inputs;

(f) a sums sharing array which can programmably multiplex subsets of outputs of the first product term summers to corresponding inputs of subsets of the second product term summers;

(d.1) wherein said logically spacing apart of the cross-lacing lines is such that complexity of sum of sums of products signals respectively output by the second product term summers are enriched by selective incorporation of one or more cross-laced signals into one or more of the inputs of sharing-array associated first product term summers associated with the second product term summers.

14. The programmable logic device of claim 13 wherein:

(f.1) each multiplexed subset of the sums sharing array has a first plural number of outputs of the first product term summers; and (d.2) said logically spacing apart of the cross-lacing lines corresponds to said first plural number.

15. The programmable logic device of claim 12 wherein:

(c.1) at least one of said programmably-activatable switch means includes a programmable signal steerer.

* * * * *